United States Patent
Liu et al.

(10) Patent No.: US 11,955,553 B2
(45) Date of Patent: Apr. 9, 2024

(54) SOURCE/DRAIN STRUCTURE

(71) Applicant: Taiwan Semiconductor Manufacturing Co., Ltd., Hsinchu (TW)

(72) Inventors: Su-Hao Liu, Jhongpu Township (TW); Kuo-Ju Chen, Taichung (TW); Wen-Yen Chen, Hsinchu (TW); Ying-Lang Wang, Tien-Chung Village (TW); Liang-Yin Chen, Hsinchu (TW); Li-Ting Wang, Hsinchu (TW); Huicheng Chang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/174,045

(22) Filed: Feb. 24, 2023

(65) Prior Publication Data
US 2023/0197852 A1 Jun. 22, 2023

Related U.S. Application Data

(60) Continuation of application No. 17/651,437, filed on Feb. 17, 2022, now Pat. No. 11,594,636, which is a
(Continued)

(51) Int. Cl.
*H01L 21/24* (2006.01)
*H01L 21/02* (2006.01)
(Continued)

(52) U.S. Cl.
CPC ...... *H01L 29/785* (2013.01); *H01L 21/02694* (2013.01); *H01L 21/324* (2013.01);
(Continued)

(58) Field of Classification Search
CPC ............ H01L 21/02694; H01L 21/324; H01L 21/7682; H01L 21/823814; H01L 21/823864
See application file for complete search history.

(56) References Cited

U.S. PATENT DOCUMENTS

2014/0264349 A1 9/2014 Sassiat et al.
2015/0206946 A1* 7/2015 Chen .................. H01L 29/0847
438/300
(Continued)

FOREIGN PATENT DOCUMENTS

EP 2058842 A2 5/2009
TW 200737355 A 10/2007
(Continued)

*Primary Examiner* — Trang Q Tran
(74) *Attorney, Agent, or Firm* — Slater Matsil, LLP

(57) ABSTRACT

Embodiments disclosed herein relate to using an implantation process and a melting anneal process performed on a nanosecond scale to achieve a high surface concentration (surface pile up) dopant profile and a retrograde dopant profile simultaneously. In an embodiment, a method includes forming a source/drain structure in an active area on a substrate, the source/drain structure including a first region comprising germanium, implanting a first dopant into the first region of the source/drain structure to form an amorphous region in at least the first region of the source/drain structure, implanting a second dopant into the amorphous region containing the first dopant, and heating the source/drain structure to liquidize and convert at least the amorphous region into a crystalline region, the crystalline region containing the first dopant and the second dopant.

20 Claims, 17 Drawing Sheets

Related U.S. Application Data continuation of application No. 16/876,436, filed on May 18, 2020, now Pat. No. 11,257,952, which is a division of application No. 16/020,443, filed on Jun. 27, 2018, now Pat. No. 10,658,510.

(51) Int. Cl.
  *H01L 21/324* (2006.01)
  *H01L 21/768* (2006.01)
  *H01L 21/8238* (2006.01)
  *H01L 29/66* (2006.01)
  *H01L 29/78* (2006.01)

(52) U.S. Cl.
  CPC .............. *H01L 21/76829* (2013.01); *H01L 21/823814* (2013.01); *H01L 21/823864* (2013.01); *H01L 29/6681* (2013.01)

(56) References Cited

U.S. PATENT DOCUMENTS

| | | |
|---|---|---|
| 2017/0213889 A1 | 7/2017 | Gluschenkov et al. |
| 2018/0076326 A1* | 3/2018 | Roh ............... H01L 29/785 |
| 2018/0277541 A1 | 9/2018 | Gluschenkov et al. |
| 2018/0294357 A1* | 10/2018 | More ............ H01L 29/66636 |
| 2020/0144395 A1 | 5/2020 | Kuang et al. |

FOREIGN PATENT DOCUMENTS

| | | | |
|---|---|---|---|
| TW | 201347010 A | 11/2013 | |
| TW | 201428874 A | 7/2014 | |
| TW | 201448053 A | 12/2014 | |
| TW | 201738943 A | 11/2017 | |

* cited by examiner

SOURCE/DRAIN STRUCTURE

PRIORITY CLAIM AND CROSS-REFERENCE

This application is a continuation of U.S. application Ser. No. 17/651,437, filed on Feb. 17, 2022, which is a continuation of U.S. application Ser. No. 16/876,436, filed on May 18, 2020, now U.S. Pat. No. 11,257,952, issued Feb. 22, 2022, which is a divisional of U.S. application Ser. No. 16/020,443, filed on Jun. 27, 2018, now U.S. Pat. No. 10,658,510, issued May 19, 2020, each application is hereby incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices.

FinFET devices typically include semiconductor regions used to form source regions and drain regions. Metal silicides are typically then formed on the surfaces of the semiconductor regions in order to reduce the contact resistance. However, with the decreasing in scaling, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
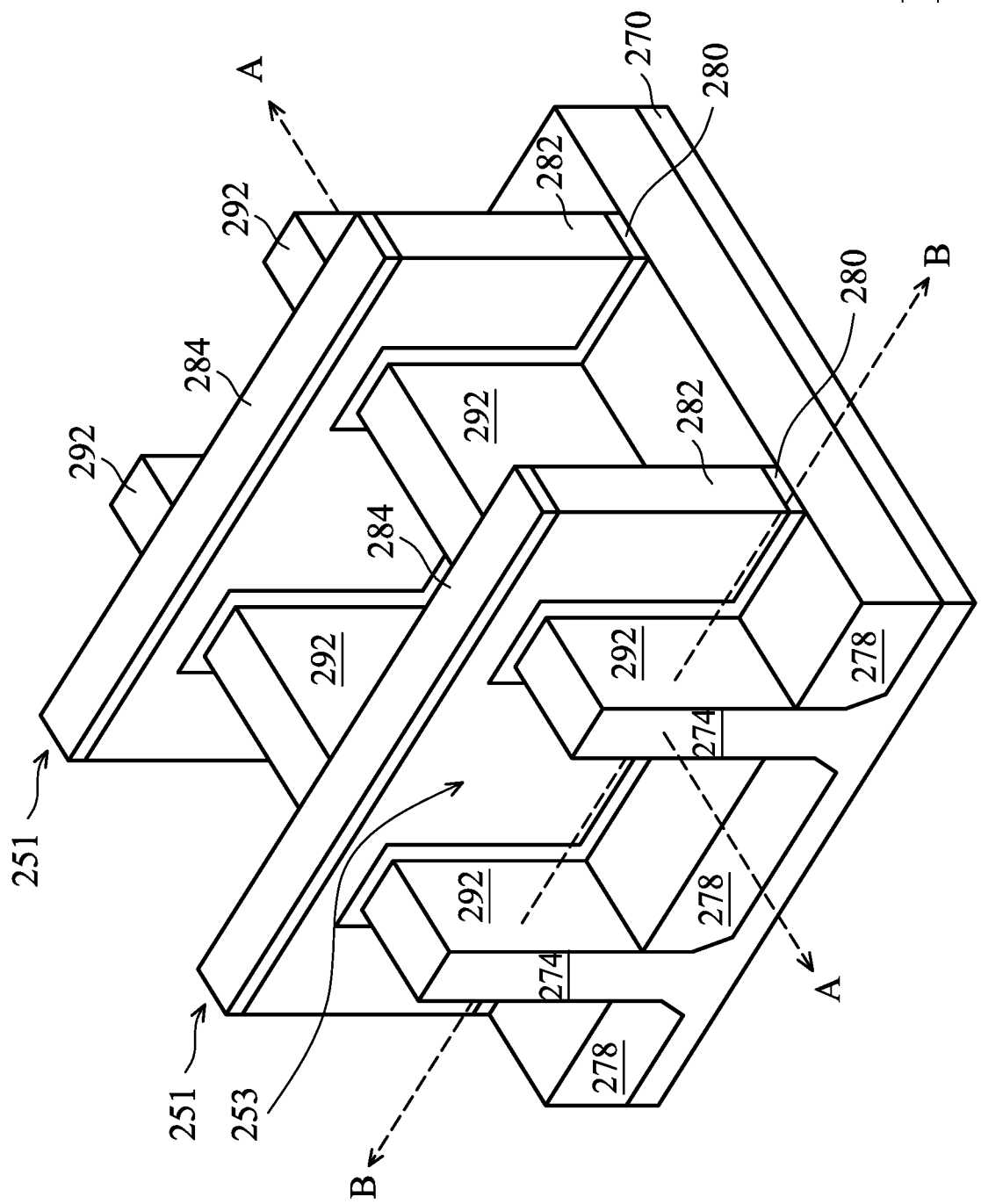
FIG. 1 illustrates a perspective view of an intermediate structure corresponding to a stage of fabrication according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments to be described below relate generally to using an implantation process and a melting anneal process performed on a nanosecond scale to achieve a high surface dopant concentration (surface pile up) dopant profile and a retrograde dopant profile simultaneously, where the concentration of the surface pile up and retrograde profiles are both higher than the original bulk concentration of the epitaxial source/drain region. Particularly, a germanium concentration and a degree of amorphousness (e.g., caused by an amorphization implant) in source/drain structures can be manipulated to allow preferential melting of the source/drain structures when exposed to the nanosecond melting anneal process. As the nanosecond melting anneal process permits a top portion of the source/drain structure to melt, the implanted dopants and germanium deeper in the source/drain structure can be brought to the top surface of the source/drain structure by the movement of the solid-liquid interface (between the molten silicon germanium and crystallized silicon germanium) during cooling/solidification of the molten silicon germanium at the top portion of the source/drain structure. As a result, a high concentration of dopants and germanium proximate the top surface of the source/drain structure can be achieved, thereby reducing a resistance of a contact to the source/drain structure.

The foregoing broadly outlines some aspects of embodiments described in this disclosure. It is contemplated that the concepts of the present disclosure may be implemented for a planar transistor device or for a three-dimensional transistor device, such as the fin field effect transistors (FinFETs) described in this disclosure. Some example devices for which aspects described herein may be implemented include Horizontal Gate All Around (HGAA) FETs, Vertical Gate All Around (VGAA) FETs, nanowire channel FETs, strained-semiconductor devices, silicon-on-insulator (SOI) devices, FinFETs having fins on a crown shape (e.g., a structure shown in FIG. 13) or non-crown shape structure.

FIG. 1 illustrates an example of an intermediate structure in a three-dimensional view. FIG. 1 also illustrates reference cross-sections that are used in later figures. Fins 274 are formed on a semiconductor substrate 270. The semiconductor substrate 270 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 270 may include an elemental semiconductor including silicon (Si) or germanium (Ge); a compound semiconductor; an alloy semiconductor; or a combination thereof. Each fin 274 provides an active area where one or more devices are or to be formed. The fins 274 can be fabricated using suitable processes performed on the semiconductor substrate 270, including masking, photolithography, and/or etch processes, to form trenches 253 into the substrate 270, leaving the fins extended upwardly from the substrate 27o. The fins 274 may be patterned by any suitable method. For example, the fins 274 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 274 and form the trenches 253.

The trenches 253 may then be filled with an insulating material such as an oxide (e.g., silicon oxide), a nitride, the like, or a combination thereof. The insulating material may be recessed, such as by using an acceptable etch process, to form the isolation regions 278. The insulating material is recessed such that the fins 274 protrude above and from between neighboring isolation regions 278.

Dummy gate structures 251 are formed on the fins 274. The dummy gate structures 251 are over and extend perpendicularly to the fins 274. Each dummy gate structure 251 may include an interfacial dielectric 280, a dummy gate 282 over the interfacial dielectric 28o, and a mask 284 over the dummy gate 282. The interfacial dielectrics 280, the dummy gates 282, and the mask 284 for the dummy gate structures 251 may be formed by sequentially forming respective layers, and then patterning those layers into the dummy gate structures 251. For example, a layer for the interfacial dielectrics 280 may include or be silicon oxide, silicon nitride, the like, or multilayers thereof. A layer for the dummy gates 282 may include or be silicon (e.g., polysilicon) or another material. A layer for the masks 284 may include or be silicon nitride, silicon oxynitride, silicon carbon nitride, the like, or a combination thereof. The layers can be formed or deposited by any suitable deposition technique. The layers for the interfacial dielectrics 28o, the dummy gates 282, and the mask 284 may then be patterned, for example, using photolithography and one or more etch processes, to form the interfacial dielectrics 28o, the dummy gates 282, and the mask 284 for each dummy gate structure 251.

Cross-section A-A in FIG. 1 is in a plane along, e.g., channels in the fin 274 between opposing source/drain structures 292. Cross-section B-B is in a plane perpendicular to cross-section A-A and is across source/drain structures 292 in neighboring fins 274.

Figure 2:
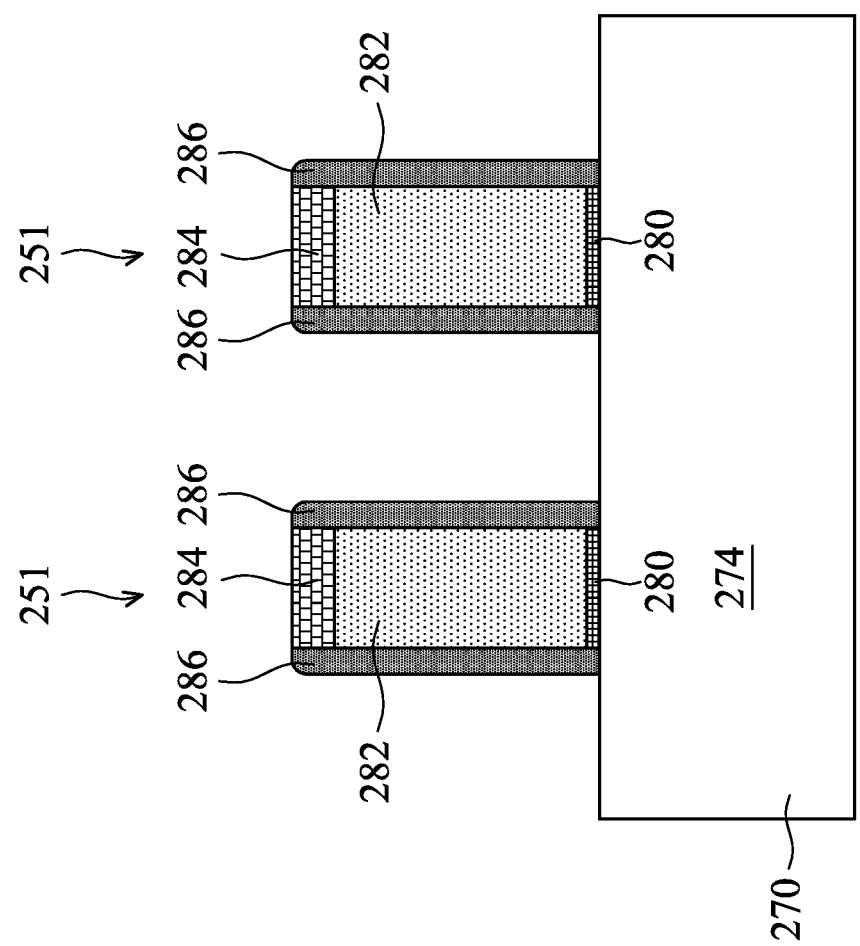
FIGS. 2 through 9 are schematic cross-sectional views of respective intermediate structures corresponding to various stages of fabrication according to some embodiments.

FIGS. 2 through 9 are schematic cross-sectional views of respective intermediate structures corresponding to various stages of fabrication and corresponding to cross-section A-A in FIG. 1. FIG. 2 illustrates gate spacers 286 formed along sidewalls of the dummy gate structures 251 (e.g., sidewalls of the interfacial dielectrics 28o, dummy gates 282, and masks 284) and over the fins 274. The gate spacers 286 may be formed by conformally depositing one or more layers for the gate spacers 286 and anisotropically etching the one or more layers, for example. The one or more layers for the gate spacers 286 may include a material different from the material(s) for the dummy gate structure 251. In some embodiments, the gate spacer 286 may include or be a dielectric material, such as silicon nitride, silicon oxynitride, silicon carbon nitride, the like, multi-layers thereof, or a combination thereof, and may be deposited by any suitable deposition technique.

Figure 3:
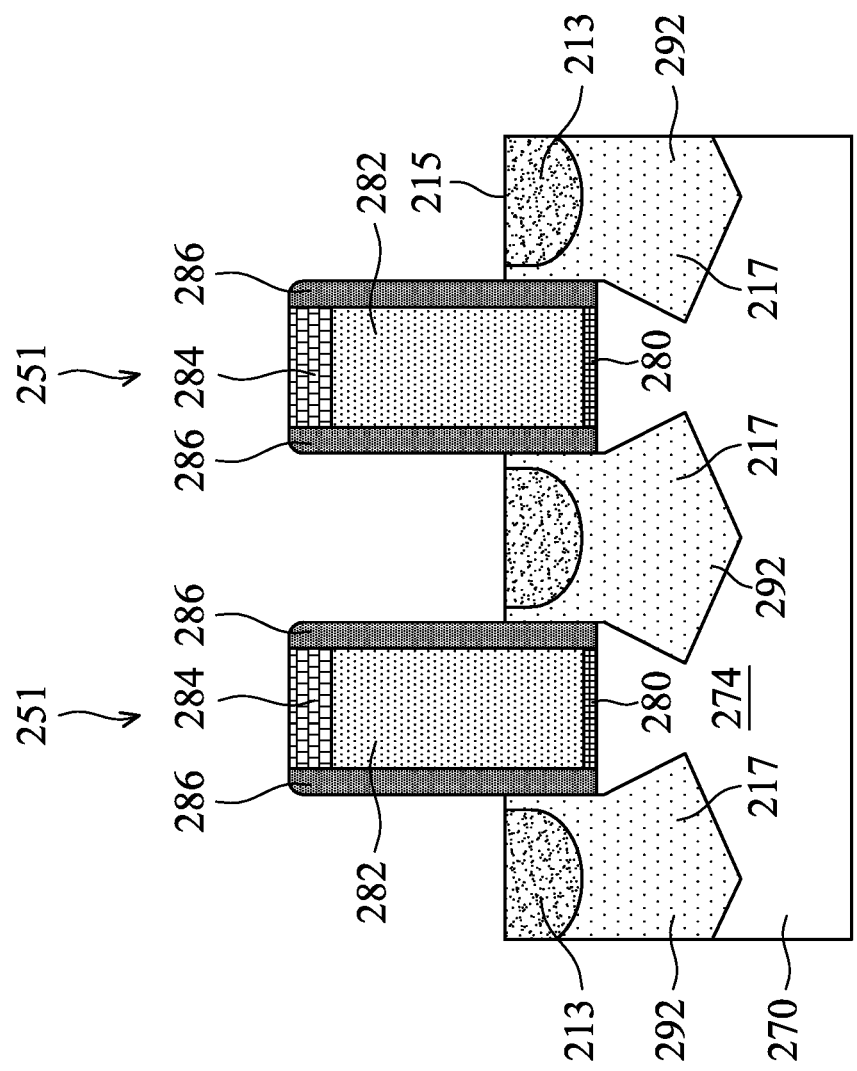

After the gate spacers 286 are formed, epitaxial source/drain structures 292 may be formed in the fins 274 on opposing sides of the dummy gate structures 251, as shown in FIG. 3. In some examples, recesses can be etched in the fins 274 using the dummy gate structures 251 and gate spacers 286 as masks, and a material may be epitaxially grown in the recesses to form the epitaxial source/drain structures 292. Additionally or alternatively, the source/drain structures 292 may be formed by implanting dopants into the fins 274 and/or the epitaxial source/drain structures 292 using the dummy gate structures 251 as masks.

Depending on the conductivity type of the transistor, the material for the epitaxial source/drain structures 292 may be chosen to include or be silicon germanium ($Si_xGe_{1-x}$, where x can be between approximately 0 and 1), silicon carbide, silicon phosphorus, silicon carbon phosphorus, germanium, a III-V compound semiconductor, a II-VI compound semiconductor, or the like. For example, materials for forming a III-V compound semiconductor may include InAs, AlAs, GaAs, InP, GaN, InGaAs, InAlAs, GaSb, AlSb, AlP, GaP, and the like. In some examples, SiGe or Si may be included in the epitaxial source/drain structures 292 for p-type devices (p-FETs) while SiCP or SiP may be included in the epitaxial source/drain structures 292 for n-type devices (n-FETs). These epitaxial source/drain structures 292 may be designed to generate strain effects and thereby enhance carrier mobility to the nFET channel or pFET channel. The epitaxial source/drain structures 292 may be raised with respect to the fin 274 and may have facets, which may correspond to crystalline planes of the semiconductor substrate 270.

Various embodiments discussed herein may provide a high surface dopant concentration for epitaxial source/drain structures and thus improve device performance. While embodiments in this disclosure are focused on the p-type devices, it is contemplated that the concept is equally applicable to the n-type devices. In some embodiments, the epitaxial source/drain structures 292 for p-type devices are silicon germanium ($Si_xGe_{1-x}$), and the concentration of germanium in SiGe is in a range from about 0 at. % to about 100 at. %, such as about 20 at. % to about 60 at. %, for example about 40 at. %. Having a high concentration of germanium (e.g., 20 at. % or more) in the SiGe can introduce strain into the transistor channel, thereby increasing mobility of holes and channel drive current. The concentration of the germanium portion may be a gradient along the thickness of the epitaxial source/drain structures 292. For example, portions of the epitaxial source/drain structures 292 towards a top surface 215 of the epitaxial source/drain structures 292 may have a greatest concentration of germanium in the epitaxial source/drain structures 292, and the concentration of germanium away from the top surface 215 may decrease as the depth in the epitaxial source/drain structures 292 increases. In some embodiments, the epitaxial source/drain structures 292 can have at least a high Ge concentration region and a low Ge concentration region. In an embodiment shown in FIG. 3, the epitaxial source/drain structures 292 for p-type devices have a first region 213 at or proximate the top surface 215 of the epitaxial source/drain structures 292, and have a second region 217 disposed outward of and/or below the first region 213. In some examples, the first region 213 may have a vertical depth in a range from about 25 nm to about 30 nm, measuring from the top surface 215. The second region 217 may have a vertical depth in a range from about 10 nm to about 20 nm, measuring from an interface between the first region 213 and the second region 217. The concentration of Ge decreases from the first region 213 to the second region 217. In some examples, the first region 213 is $Si_{1-x}Ge_x$ and may have a concentration of Ge in a range from about 20 at. % to about 100 at. %, for example, about 25 at. % to about 80 at. %, for example about 40 at. % to about 60 at. %. Further, in some examples, the second region 217 is also $Si_{1-y}Ge_y$ and may have a concentration of Ge in a range from about 0 at. % to about 25 at. %, for example about 5 at. % to about 15 at. %.

Different germanium concentrations can be obtained by varying the germanium-containing precursor gas flow rates with a constant silicon-containing precursor gas flow during a process. For example, during formation of the second region 217, the Ge concentration can vary in a range from about 5 at. % to about 15 at. %. During formation of the first region 213, the Ge concentration can vary in a range from about 25 at. % to about 80 at. %. Suitable silicon-containing precursor gas may include or be silane ($SiH_4$) or higher silanes with the empirical formula $Si_xH_{(2x+2)}$, such as disilane ($Si_2H_6$), trisilane ($Si_3H_8$), tetrasilane ($Si_4H_{10}$), or any combination thereof. Suitable germanium-containing precursor gas may include or be germane ($GeH_4$), digermane ($Ge_2H_6$), or any combination thereof. The epitaxial source/drain structures 292 may be epitaxially formed using a chemical vapor deposition (CVD), a low-pressure chemical vapor deposition (LPCVD), a reduced pressure chemical vapor deposition (RPCVD), or the like.

Figure 4:
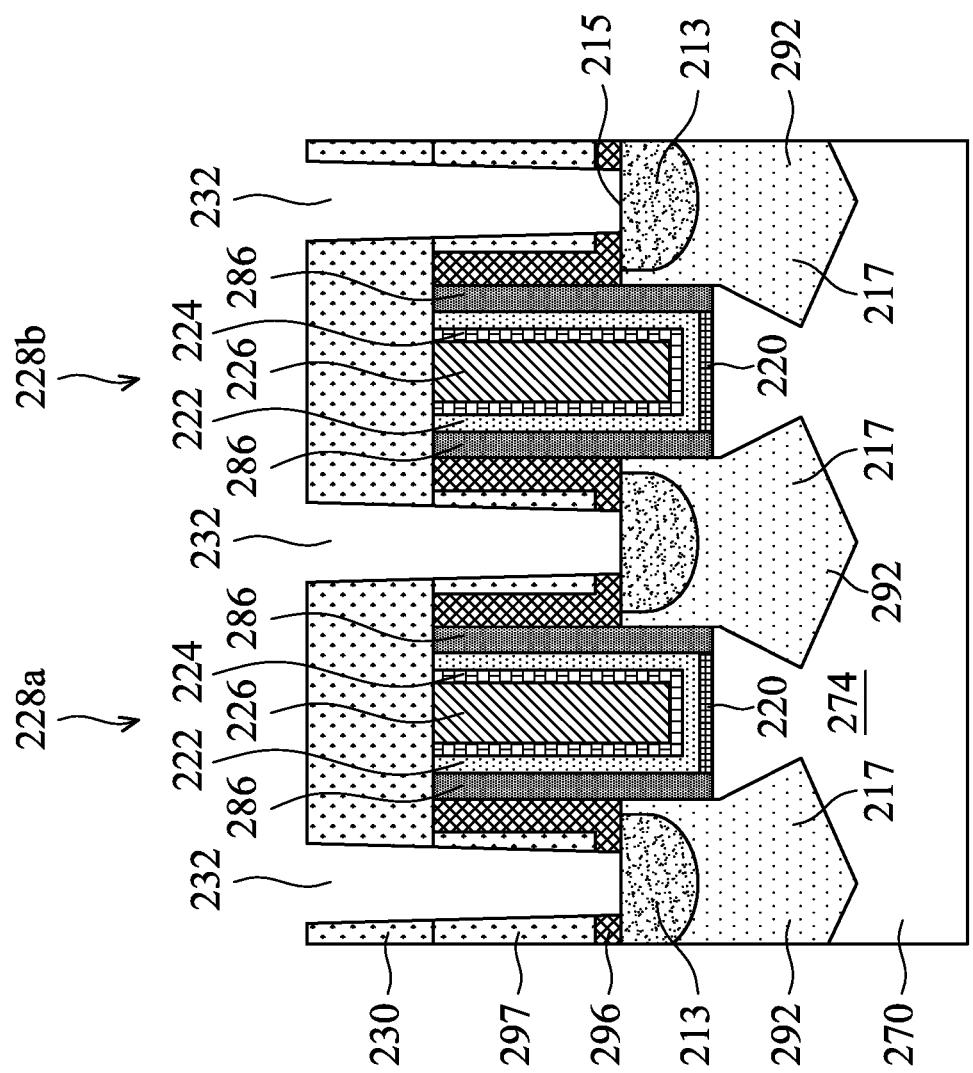

Referring to FIG. 4, a contact etch stop layer (CESL) 296 and a first interlayer dielectric (ILD) 297 are sequentially formed on surfaces of the epitaxial source/drain structures 292, sidewalls and top surfaces of the gate spacers 286, top surfaces of the masks 284, and top surfaces of the isolation regions 278 using any suitable deposition technique. The CESL 296 is deposited conformally and may include or be silicon nitride, silicon carbon nitride, carbon nitride, the like, or a combination thereof. The first ILD 297 may include or be tetraethylorthosilicate (TEOS) oxide, silicon dioxide, a low-k dielectric material (e.g., a material having a dielectric constant lower than silicon dioxide), or the like. A chemical mechanical planarization (CMP) process may then be performed to planarize the first ILD 297 and the CESL 296 and to remove the masks 284 of the dummy gate structures 251, thereby leveling the top surface of the first ILD 297 and CESL 296 with the top surfaces of the dummy gates 282.

The dummy gate structures 251 are then removed using one or more etch processes. Upon removal of the dummy gate structures 251, recesses are formed between the gate spacers 286 where the dummy gate structures 251 are removed, and channel regions of the fins 274 are exposed through the recesses. The replacement gate structures 228a, 228b are then formed in the recesses where the dummy gate structures 251 were removed, as shown in FIG. 4. The replacement gate structures 228a, 228b each may include an interfacial dielectric 220, a gate dielectric layer 222, one or more optional conformal layers 224, and a gate fill conductive material 226. The interfacial dielectric 220 is formed on top surfaces of the fins 274 along the channel regions. The interfacial dielectric 220 can be an oxide (e.g., silicon oxide) formed by thermal or chemical oxidation of the fin 274, and/or an oxide (e.g., silicon oxide), nitride (e.g., silicon nitride), and/or another dielectric layer using any suitable deposition technique.

The gate dielectric layer 222 can be conformally deposited in the recesses where the dummy gate structures 251 were removed (e.g., on the interfacial dielectric 220, and sidewalls of the gate spacers 286) and on the top surfaces of the first ILD 297, the CESL 296, and gate spacers 286. The gate dielectric layer 222 can be or include silicon oxide, silicon nitride, a high-k dielectric material, multilayers thereof, or other dielectric material. A high-k dielectric material may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof.

The one or more optional conformal layers 224 can include one or more barrier and/or capping layers and one or more work-function tuning layers. The one or more barrier and/or capping layers can include tantalum nitride, titanium nitride, the like, or a combination thereof. The one or more work-function tuning layer may include or be aluminum titanium carbide, aluminum titanium oxide, aluminum titanium nitride, the like, or a combination thereof. The materials for the one or more work-function tuning layer, the barrier layer and/or capping layer are selected so that a desired threshold voltage (Vt) is achieved for the transistor, which could be a p-type field effect transistor (pFET) or an n-type field effect transistor (nFET). A gate fill conductive material 226 is formed over the one or more conformal layers 224, if implemented, and/or the gate dielectric layer 222. The gate fill conductive material 226 can fill remaining recesses where the dummy gate structures 251 were removed. The gate fill conductive material 226 may be or include a metal-containing material such as tungsten, cobalt, aluminum, ruthenium, copper, multi-layers thereof, a combination thereof, or the like.

A planarization process, like a CMP, may remove portions of the gate fill conductive material 226, one or more conformal layers 224, and gate dielectric layer 222 above the top surfaces of the first ILD 297, the CESL 296, and gate spacers 286. The replacement gate structures 228a, 228b, each including the gate fill conductive material 226, one or more conformal layers 224, gate dielectric layer 222, and interfacial dielectric 220, may therefore be formed as illustrated in FIG. 4.

FIG. 4 further illustrates a second ILD 230 formed over the gate fill conductive material 226, one or more conformal layers 224, and gate dielectric layer 222, first ILD 297, gate spacers 286, and CESL 296. The second ILD 230 may include or be silicon dioxide, a low-k dielectric material, silicon oxynitride, phosphosilicate glass (PSG), borosilicate glass (BSG), borophosphosilicate glass (BPSG), undoped silicate glass (USG), fluorosilicate glass (FSG), organosilicate glass (OSG), $SiO_xC_y$, silicon carbon material, a compound thereof, a composite thereof, the like, or a combination thereof.

After the second ILD 230 is formed, source/drain contact openings 232 are formed through the second ILD 230, the first ILD 297, and the CESL 296 to expose at least portions of the epitaxial source/drain structures 292, as an example shown in FIG. 4. The second ILD 230, the first ILD 297, and the CESL 296 may be patterned with the openings 232, for example, using photolithography and one or more etch processes. The source/drain contact openings 232 allow making electrical contact to the epitaxial source/drain structures 292 for the transistors.

Figure 5:
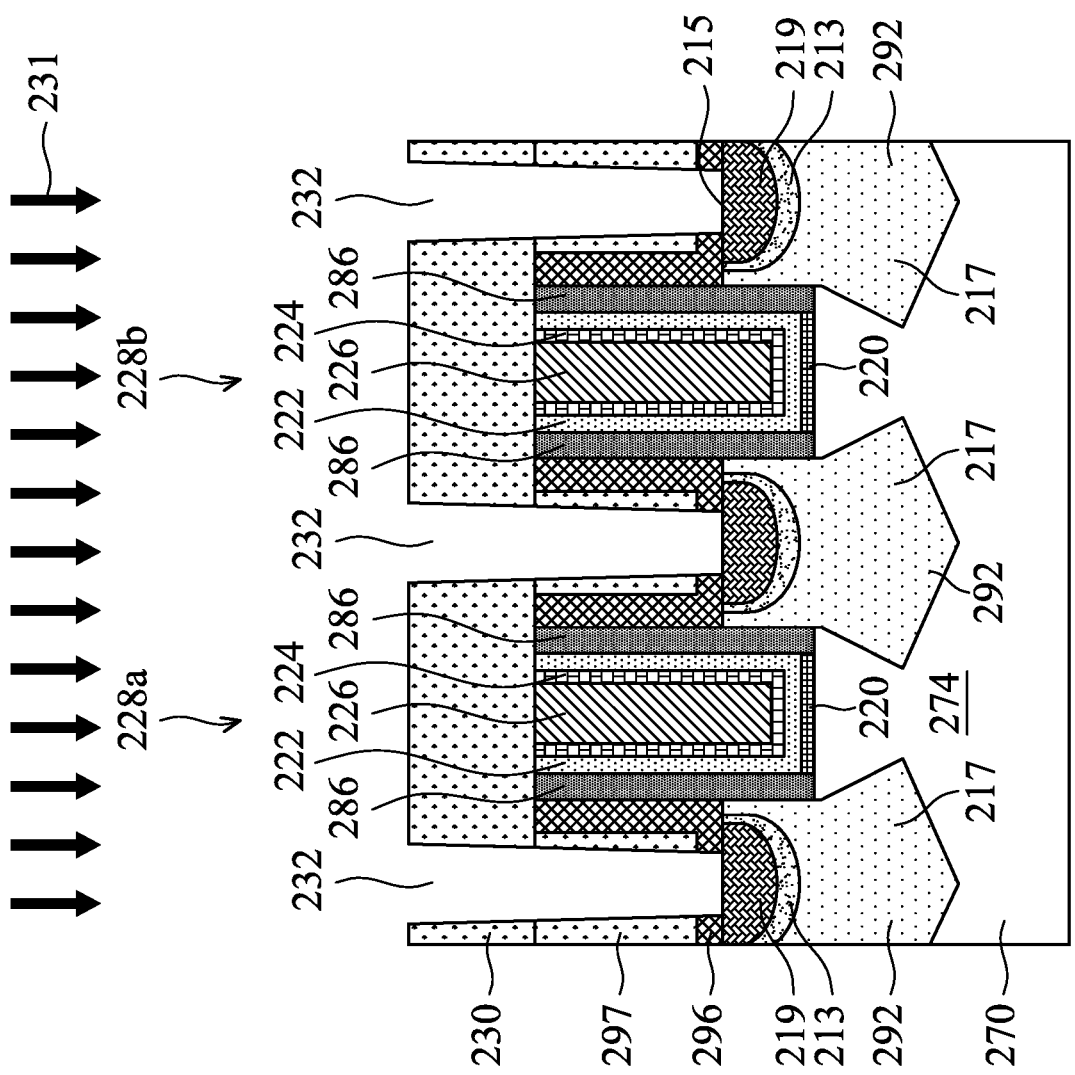

After the formation of the source/drain contact openings 232, a pre-amorphization implantation (PAI) process 231 is performed to amorphize a portion of the exposed epitaxial source/drain structures 292 where silicide regions are to be formed. The PAI process injects an impurity species into the epitaxial source/drain structures 292 to form an amorphous region 219, as shown in FIG. 5. In some examples, the amorphous region 219 may have a depth from about 1 nm to about 20 nm, measuring from a top surface of the epitaxial source/drain structures 292. In an embodiment, the PAI process 231 is an ion implantation process which introduces first species into the exposed epitaxial source/drain structures 292 such that at least a top portion of the epitaxial source/drain structures 292 is converted into an amorphous structure. The amorphous regions 219 can prevent subsequently implanted dopants/impurities from diffusing through the spaces between the crystal lattice structure and reaching depths greater than desired. Therefore, the subsequent dopants/impurities can be confined at a region within the amorphous regions 219 and/or proximate a top surface of the epitaxial source/drain structures 292. As a result, a contact resistance between the respective epitaxial source/drain structure 292 and a conductive feature that is subsequently formed on the epitaxial source/drain structure 292 can be greatly reduced.

The first species to be implanted may be an electrically inactive species, such as silicon, germanium, carbon, nitrogen, xenon, argon, and/or other suitable electrically inactive species. In some embodiments, the first species is silicon. In some embodiments, the first species is germanium. In some embodiments, the first species includes atoms and/or molecules larger than the material of the epitaxial source/drain structures 292 (such as silicon germanium). In an example, the first species is gallium ($Ga^{69}$). The PAI process using gallium as the first species can be advantageous in some applications because gallium typically has higher solid solubility in germanium-based source/drain structures than other dopant species, such as boron. For example, gallium can have a higher solid solubility in the region having a high concentration of germanium (e.g., the first region 213) than boron. Therefore, higher dopant activation can be achieved with a gallium implant. In addition, gallium can damage and cause greater distortion of the crystal lattice structure of silicon germanium than other implant species (e.g., Si, C, or N) due to its larger size on an atomic scale, thereby increasing the amorphousness of the crystal structure in the implanted regions. As will be discussed in more detail below, higher amorphousness achieved by the PAI process using gallium and the high germanium concentration at the first region 213 can help lower the melting point of the implanted regions in the epitaxial source/drain structures 292, which helps a subsequent self-selected anneal process to preferentially melt the implanted regions and allow a high dopant concentration to be created proximate the top surface 215 of the epitaxial source/drain structure 292.

The PAI process 231 may be performed on the semiconductor substrate 270, using the second ILD 230, the first ILD 297, and/or the CESL 296 collectively as an implantation mask, so that the amorphous regions 219 are formed in the epitaxial source/drain structures 292 exposed within the source/drain contact openings 232. The amorphous regions 219 generally have the first species randomly distributed therein. In some embodiments, the PAI process 231 may create a Gaussian distribution of the first species within the crystal lattice of the epitaxial source/drain structures 292, with the peak or highest concentration of atoms being near the top surface 215 of the epitaxial source/drain structures 292, and a lower concentration deeper into the epitaxial source/drain structures 292. In some examples, the first species may have a peak concentration in a range from about $1 \times 10^{19}$ $cm^{-3}$ to about $1 \times 10^{21}$ $cm^{-3}$ or greater at a vertical depth in a range from about 4 to about 20 nm, and the concentration gradient of the first species may decrease at a rate of about 1 decade per about 4 nm to about 8 nm.

In an example embodiment, the first species are implanted using an energy in a range from about 1 keV to about 20 keV, for example about 3 keV to about 10 keV, with a dosage in a range from about $1 \times 10^{13}$ $cm^{-2}$ to about $1 \times 10^{15}$ $cm^{-2}$. The temperature of the semiconductor substrate 270 during the PAI process can be maintained at a temperature in a range from about −100° C. to about 500° C. In an example where the first species is gallium, the temperature of the semiconductor substrate 270 during the PAI process is maintained at about −60° C. The first species may be tilt implanted with a tilt angle between about 0 degree and about 60 degrees from a vertical.

It is understood that while the amorphous regions 219 are shown as being confined within the boundary of the first region 213, in some embodiments the amorphous regions 219 may beyond the first region 213. The depth of the amorphous regions 219 may vary depending upon the application, and can be controlled by changing the implantation energy/dosage, substrate temperature, and/or the tilt angle.

After the amorphous regions 219 are formed in the exposed epitaxial source/drain structures 292, a dopant implantation process 293 may be performed to introduce a second species (e.g., dopants) to the exposed epitaxial source/drain structures 292. The dopant implantation process 293 is designed to increase the doping concentration at the silicide/doped region interface, and thus, the contact resistance between the respective epitaxial source/drain structure 292 and a conductive feature that is subsequently formed can be reduced. In cases where the first species use gallium, the majority of the second species can be trapped or confined within the amorphous regions 219 due to the presence of a large number of dangling bonds and random distribution of the large size gallium in the amorphous regions 219. As a result, the dopant activation at the surface of the epitaxial source/drain structures 292 can be improved, and hence, further reduce the contact resistance for the devices.

For p-type devices, the second species may include boron, aluminum, gallium, indium, or any combination thereof. In an embodiment, the second species is boron. In some cases, the second species may also include n-type dopants such as phosphorous, arsenic, antimony, etc. The dopant implantation process can be optional, such as if the first species used in the PAI process provides desired and/or suitable conductivity for the device.

Figure 6:
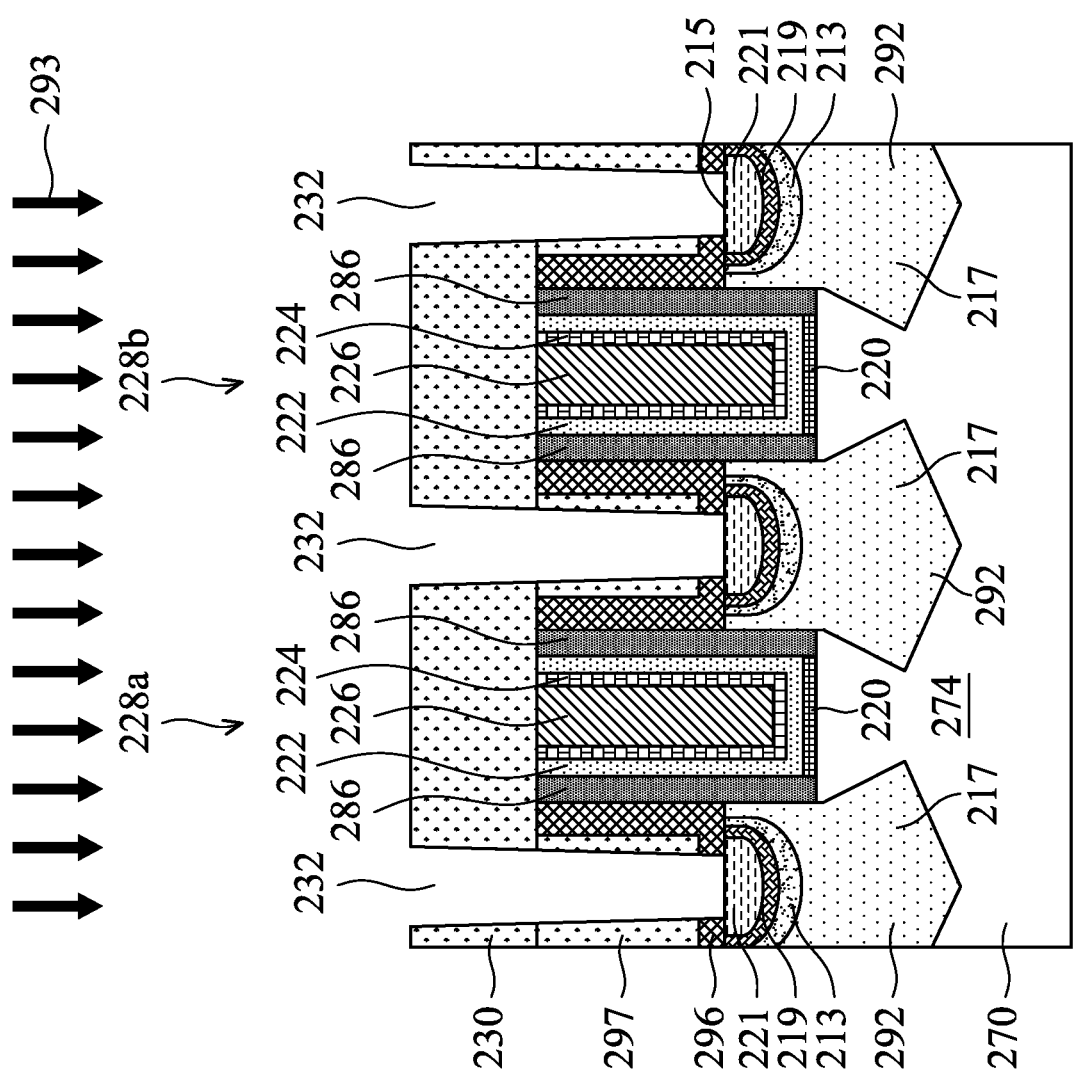

The second species is implanted into substantially the same regions as the first species using an ion implantation process, thereby forming a doped region 221 in the exposed epitaxial source/drain structures 292, as shown in FIG. 6. The doped regions 221 may overlap the amorphous regions 219, such that the second species may be randomly distributed in the amorphous regions 219 containing the first species. In some embodiments, the dopant implantation process may create a distribution of the second species within the amorphous regions 219, with the peak or highest concentration of second species being near the top surface 215 of the epitaxial source/drain structures 292, and a lower concentration deeper into the amorphous regions 219 (or epitaxial source/drain structures 292). In an embodiment, the second species has a peak concentration in a range from about $1\times10^{21}$ cm$^{-3}$ to about $2\times10^{22}$ cm$^{-3}$ at a vertical depth in a range from about 1 nm to about 10 nm, and the concentration of the second species decreases in the epitaxial source/drain structure 292 from the peak concentration of the second species in a direction away from the top surface 215 of the epitaxial source/drain structure 292. The depth of the doped regions 221 can be controlled by changing the implantation energy/dosage, substrate temperature, and/or the tilt angle. While the amorphous regions 219 may generally have a greater, deeper distribution within the epitaxial source/drain structures 292 than that of the doped regions 221, in some embodiments the doped regions 221 may extend over the boundary of the amorphous regions 219 to a region between the boundary of the amorphous region 219 and the boundary of the first region 213. In some embodiments, the doped regions 221 may further extend into the second region 217. In most cases, the diffusion of the dopants can be further increased by the subsequent annealing processes.

In an example embodiment, the second species (e.g., boron) is implanted using an energy in a range between about 0.5 keV and about 10 keV, with a dosage in a range from about $1\times10^{13}$ cm$^{-2}$ to about $1\times10^{16}$ cm$^{-2}$, for example about $2\times10^{15}$ cm$^{-2}$. If desired, the p-type dopant may be tilt implanted with a tilt angle in a range between about 0 degree and about 30 degrees from vertical.

Figure 7:
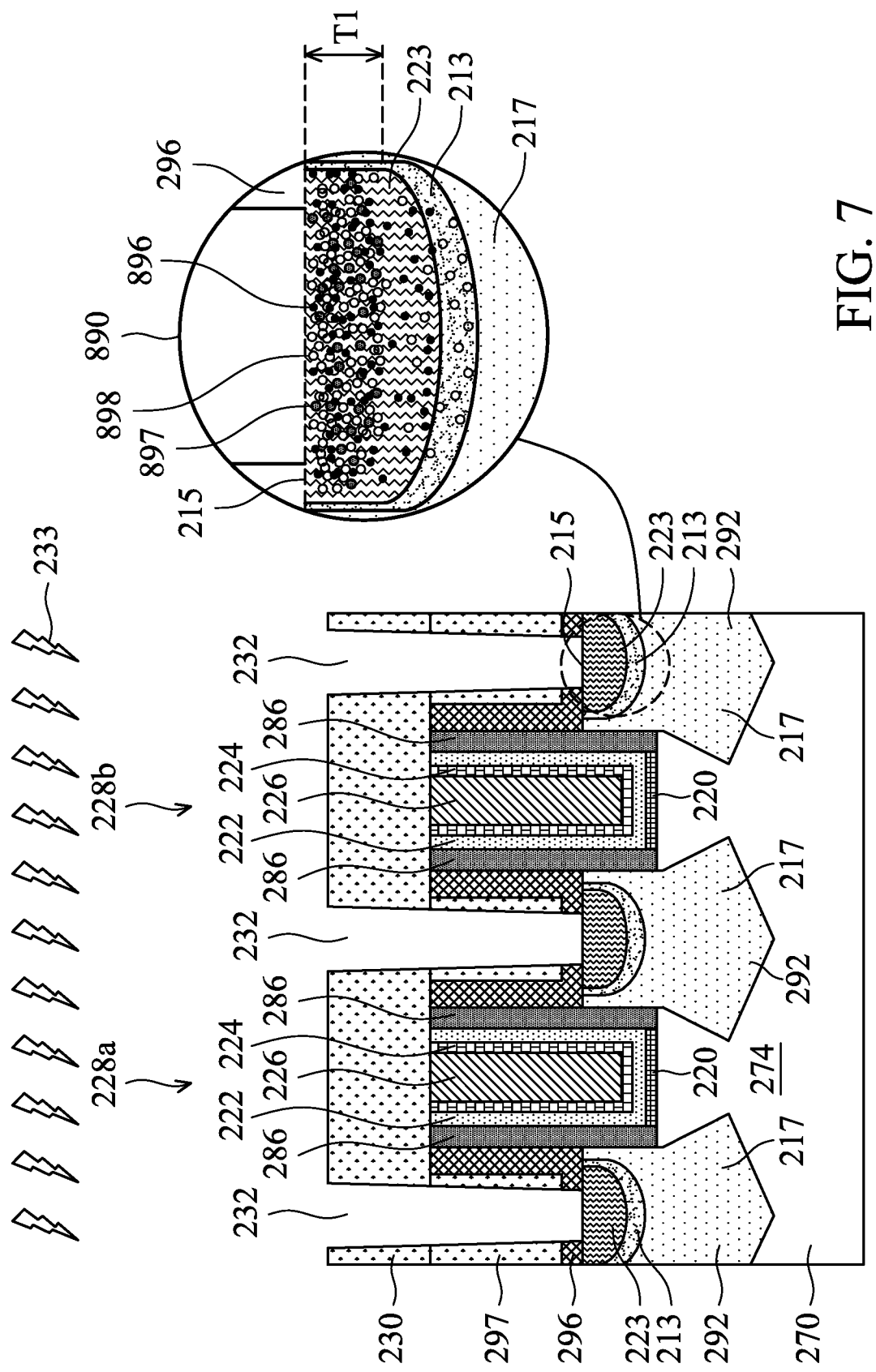

After the optional dopant implantation process, a melting anneal (MLA) process 233 is performed to activate the dopants in the epitaxial source/drain structures 292. The MLA process 233 may also re-crystallize the epitaxial source/drain structures that were made amorphous, thereby turning the amorphous regions 219 into crystalline regions 223 that are defect free, as shown in FIG. 7. In various embodiments, the MLA process 233 is performed on a nanosecond (ns) scale. Performing the MLA process 233 in the range of nanoseconds can be advantageous in some applications because the dopants can be activated with minimal or no diffusion out of the epitaxial source/drain structures 292 even at high annealing temperature (e.g., 850° C. or above). Since the dopants in the epitaxial source/drain structures 292 are activated with minimal diffusion, short channel effect can be prevented. In addition, the epitaxial source/drain structures 292, particularly the top portion of the epitaxial source/drain structures 292, can be preferentially melted during such extremely short annealing due to its lower melting temperature. As discussed above, the top portion of the epitaxial source/drain structures 292 includes the first region 213 having a germanium concentration of about 40 at. % or greater and the amorphous regions 219 having a high degree of amorphousness. Since the melting point of germanium is generally lower than that of silicon, the first region 213 having high concentration of germanium can have a lower melting point. A high concentration of germanium and high amorphousness of the amorphous regions 219 together can render the top portion of the epitaxial source/drain structures 292 to become a region having a lower melting point than other areas of the substrate. Therefore, when exposing the semiconductor substrate 270 to the MLA process 233, the top portion of the epitaxial source/drain structures 292 can be preferentially melted or annealed (e.g., self-selected annealed).

It is contemplated that selective or preferential melting of desired regions of the semiconductor substrate 270, such as the top portion of the epitaxial source/drain structures 292, can be achieved by changing the atomic percentage and/or distribution of germanium in at least the first region 213 of the epitaxial source/drain structures 292. For example, the germanium concentration in the first region 213 may be increased to lower the melting point of the epitaxial source/drain structures 292. In some embodiments, selective or preferential melting of desired regions of the epitaxial source/drain structures 292 can also be achieved by changing a degree of amorphousness of the amorphous regions 219. For example, the implant energy and/or the dosage of the first species (e.g., Ga or Ge) may be increased to raise the amorphousness of the amorphous regions 219. Implantation of the first species can reduce the melting point of the epitaxial source/drain structures 292 due to the damage or change in the bonding structure of atoms in the epitaxial source/drain structures 292. The amorphousness of an amorphous region may be defined by the weight ratio of the amorphous to crystalline component. In some examples, the amorphousness of the amorphous regions 219 may be in a range from about 1:5 (crystalline:amorphous) to about 1:1000 (crystalline:amorphous), such as about 1:30 (crystalline:amorphous) to about 1:100 (crystalline:amorphous).

Particularly, it has been observed that the MLA process 233 performed in the range of nanoseconds can provide both a surface pile up profile and a retrograde profile of the dopants. In some examples, the retrograde profile is located following the surface pile up, which is proximate the top surface 215 of the epitaxial source/drain structures 292. An example retrograde profile will be discussed in more detail in FIG. 11 below. A surface pile up profile may be due to short annealing that causes the top portion of the epitaxial source/drain structures to melt or liquidize, while the remainder of the epitaxial source/drain structures remains generally in solid phase. Since the impurities tend to concentrate at the liquid and/or solid-liquid interface (between the molten silicon germanium and crystallized silicon germanium, for example) of the solidifying epitaxial source/drain structures, the implanted dopants (e.g., first and second species) and germanium deeper in the epitaxial source/drain structures can be brought up to a region near the top surface 215 of the epitaxial source/drain structures by moving along with the solid-liquid interface during solidification of the molten silicon germanium. As a result, the implanted dopants and the germanium in the upper portion of the epitaxial source/drain structures 292 (e.g., first region 213 and the amorphous region 219) can be moved upwardly and piled up at a region close (e.g., about 1 nm) to the top surface 215 of the epitaxial source/drain structures 292, converting the original Gaussian distribution of the second species (e.g., B) into a surface pile up profile and a retrograde profile. The origin of B retrograde profile is due to the surface pile up of Ge element since the solid solubility of B is lower with higher Ge concentrations. The retrograde profile provides a higher bulk dopant concentration than that of as-IMP/as-EPI, which will provide better conductivity for a device.

Inset 890 in FIG. 7 is an enlarged partial view of a portion of the epitaxial source/drain structures 292 showing the crystalline regions 223 according to some embodiments. In an embodiment, first species 896, second species 898, and the germanium atoms 897 are piled up within a vertical depth Ti below the top surface 215 of the epitaxial source/drain structures 292 after the MLA process. In an example, the vertical depth Ti is in a range from about 0.5 nm to about 6 nm. In some embodiments, the crystalline regions 223 may include a concentration gradient below the vertical depth Ti where a peak concentration of the mixture of first species 896, the second species 898, and the germanium atoms 897 is located at and/or proximate the top surface 215 of the epitaxial source/drain structures 292, with a lower concentration (e.g., an order magnitude lower than the peak concentration) of the first species 896 and the germanium atoms 897 deeper into the crystalline regions 223 (e.g., towards a direction away from the top surface 215). In an example, the crystalline regions 223 is silicon germanium having retrograde dopant profile of second species (e.g., B). In cases where the first species is gallium/germanium and the second species is boron, the crystalline regions 223 may include gallium-doped and/or boron-doped silicon germanium, wherein the concentration of germanium is about 60 at. % or above, for example about 82 at. %.

Furthermore, due to the surface pile up profile of the dopants achieved by the nanosecond MLA process, the germanium concentration in the top portion of the epitaxial source/drain structures 292 can be increased to 65 at. %, or even to about 80 at. %, such as when the initial germanium concentration in the first region 213 is in a range from about 40 at. % to about 60 at. %. Therefore, even though the germanium concentration in the epitaxial source/drain structures 292 remains the same, the nanosecond MLA process can cause the concentration of the germanium at the first region 213 to increase by moving germanium atoms from the lower portion (e.g., the second region 217) of the epitaxial source/drain structures 292 to the top portion of the epitaxial source/drain structures 292. The lower the initial germanium concentration is in the first region 213, the higher the melting point can be in the first region 213 of the epitaxial source/drain structures 292. This allows greater room for high temperature processes to occur in the various processes, and hence, can lower the impact on the overall thermal budget for the device fabrication.

The MLA process may utilize any suitable electromagnetic energy to achieve the annealing times in the range of nanoseconds, such as an optical radiation source, an electron beam source, or a microwave energy source. In an embodiment, the MLA process is performed by an optical radiation source using a laser. In such a case, the laser anneal process 233 may be performed by scanning a laser beam from an energy source across the exposed surface of the epitaxial source/drain structures 292. In some embodiments, the laser beam may be applied to entire semiconductor substrate 270 or portions of the semiconductor substrate 270. In any case, the laser beam may be delivered to the target area while the semiconductor substrate 270 is translated, or scanned, relative to the energy (or vice versa) delivered to the target area. For example, the laser beam may anneal a first portion (e.g., exposed surface of the epitaxial source/drain structures) of a semiconductor substrate for a first device, then the semiconductor substrate 270 and/or laser beam may be moved, and the laser beam may anneal a second portion (e.g., exposed surface of the epitaxial source/drain structures) of a semiconductor substrate for a second device.

The energy source may be any type of laser such as gas laser, excimer laser, solid-state laser, fiber laser, semiconductor laser, etc. The laser beam may have a constant energy flux. In some embodiments, the laser beam may have a wavelength in a range from about 200 nm to about 20 micrometers, such as from about 280 nm to about 1200 nm, for example about 300 nm to about 1000 nm, and the laser beam may deliver an energy density that is capable of melting the exposed epitaxial source/drain structures 292 or less than that required to melt the exposed epitaxial source/drain structures 292. In some examples, the energy density may be delivered in a range from about 0.01 J/cm$^2$ to about 5 J/cm$^2$. The dwell time of the laser beam may be in a range from about 1 nanosecond to about 1000 nanoseconds, such as about 10 nanoseconds to about 500 nanoseconds, for example about 20 nanoseconds to about 200 nanoseconds.

The parameters discussed herein may vary depending upon the application. In some embodiments, the laser anneal process is performed so that each portion having the laser beam incident thereon can be momentarily elevated to a temperature close to or above the melting point of the material being annealed. Therefore, the annealing temperature may vary depending upon the melting point of the material to be annealed. In an example where the epitaxial source/drain structures 292 are formed of silicon germanium having a germanium concentration in a range from about 30 at. % to about 60 at. %, the annealing temperature may be about 850° C. or greater, for example in a range from about 920° C. to about 1250° C. This temperature may allow the annealed regions to become melted or sub-melted. The annealed regions may become sub-melted when the material of the annealed regions is heated to a temperature that is about 80% of the melting temperature in degrees Celsius of the material or more, for example about 90%, and more particularly, about 97%, of the melting temperature.

Figure 14A:
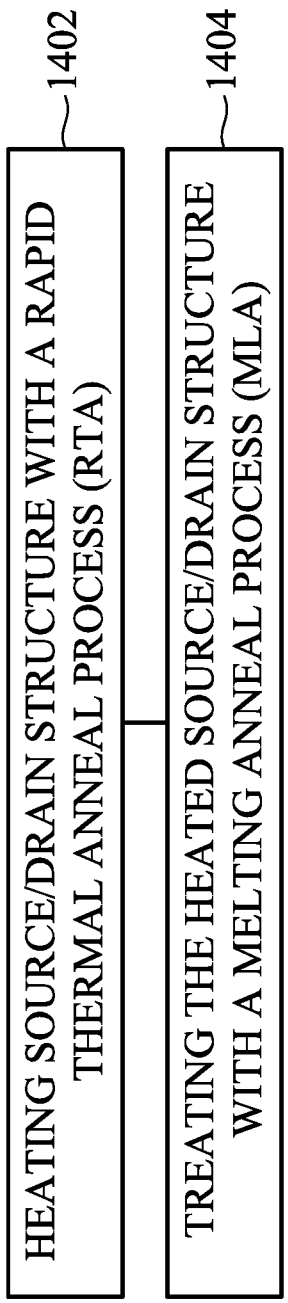
FIGS. 14A-14G illustrate thermal treatment of a source/drain structure in accordance with various embodiments.

In an embodiment shown in FIG. 14A, a rapid thermal anneal (RTA) 1402 may be performed prior to the MLA process 233 (labeled as 1404 in FIG. 14A). In this embodiment, the RTA process may recrystallize or repair the lattice structure of the amorphous regions 219 due to the gallium or germanium implant in the epitaxial source/drain structures 292. The subsequent MLA process 233 can then activate and move up the implanted dopants and the germanium to a region near the top surface 215 of the epitaxial source/drain structures 292 in a manner as discussed above. As a result, a retrograde B profile and surface pile up germanium profile are obtained within the epitaxial source/drain structures 292. The RTA process may be performed by heating the intermediate structure of FIG. 7 using lamps, such as an array of halogen lamps or flash lamps. An example embodiment using a halogen lamp annealing process may include heating and maintaining the intermediate structure of FIG. 7 to a temperature of about 300° C. or above, for example in a range from about 400° C. to about 900° C. Then, light of a halogen lamp is irradiated on the exposed surface of the intermediate structure of FIG. 7 in a range from about 1 second to about 600 seconds, such as about 1 second to about 180 seconds, to further heat the surface of the intermediate structure of FIG. 7, for example the top surface 215 of the epitaxial source/drain structures 292, to a temperature in a range from about 400° C. to about 800° C., such as about 550° C. to about 700° C. In some embodiments, the RTA process may be performed after the MLA process 233.

Figure 14B:
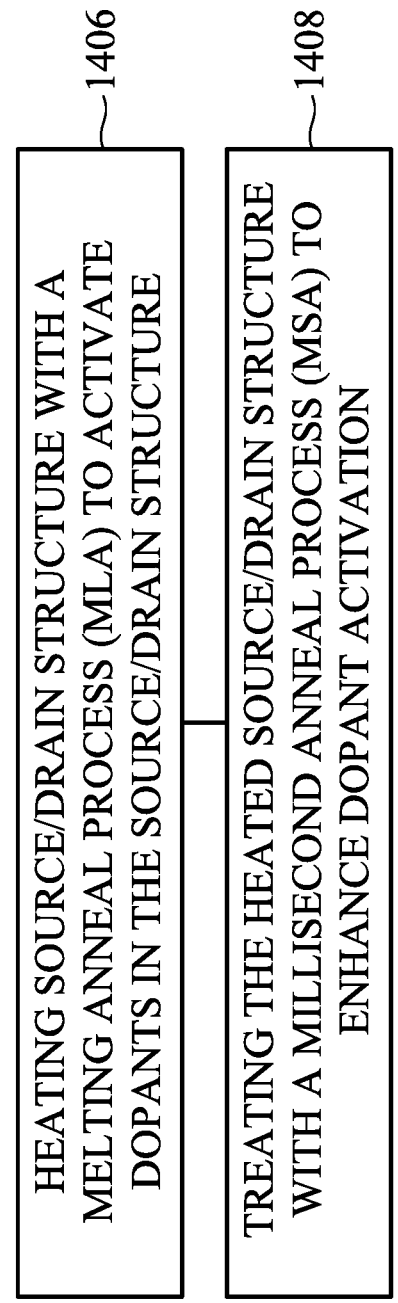
Figure 14C:
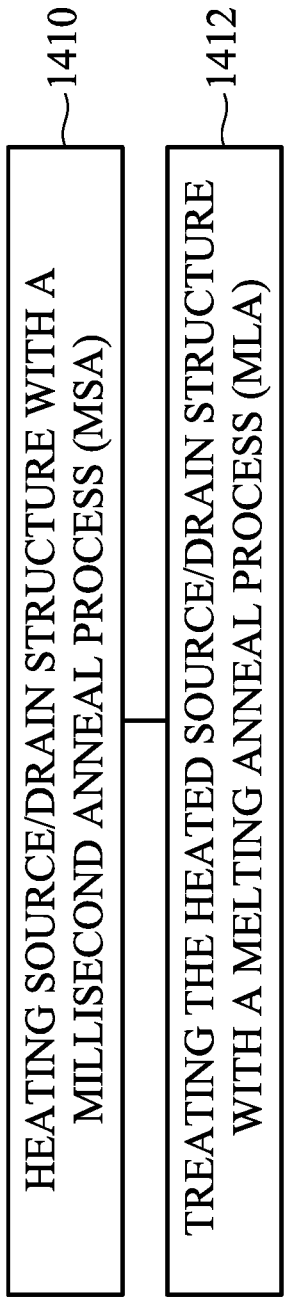
Figure 14D:
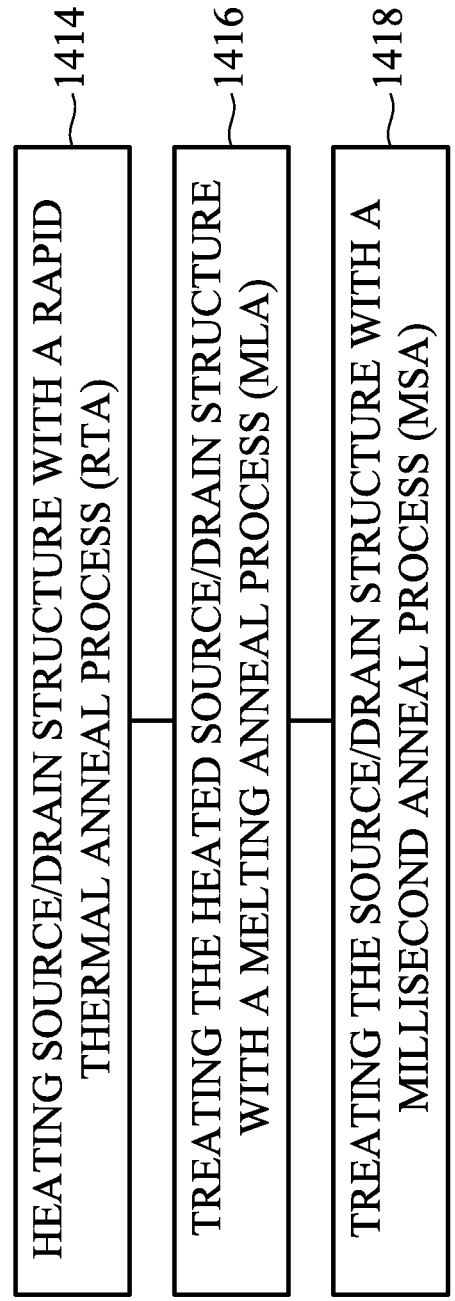
Figure 14E:
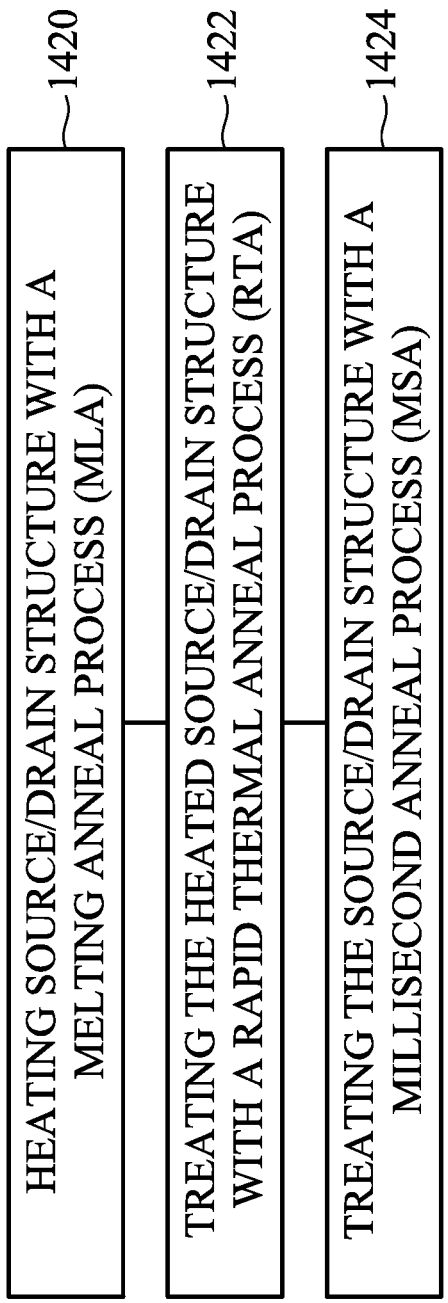
Figure 14F:
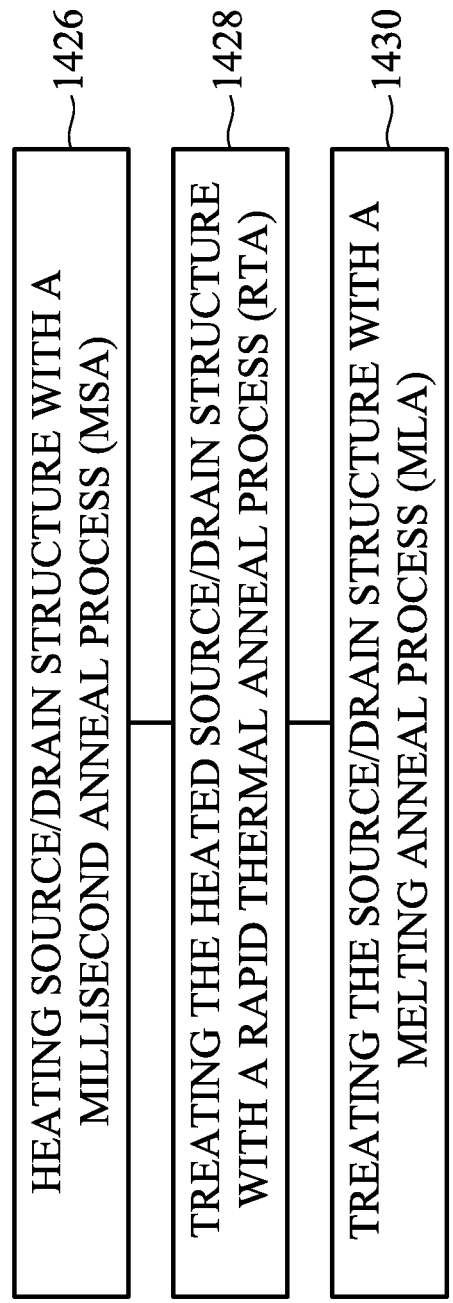
Figure 14G:
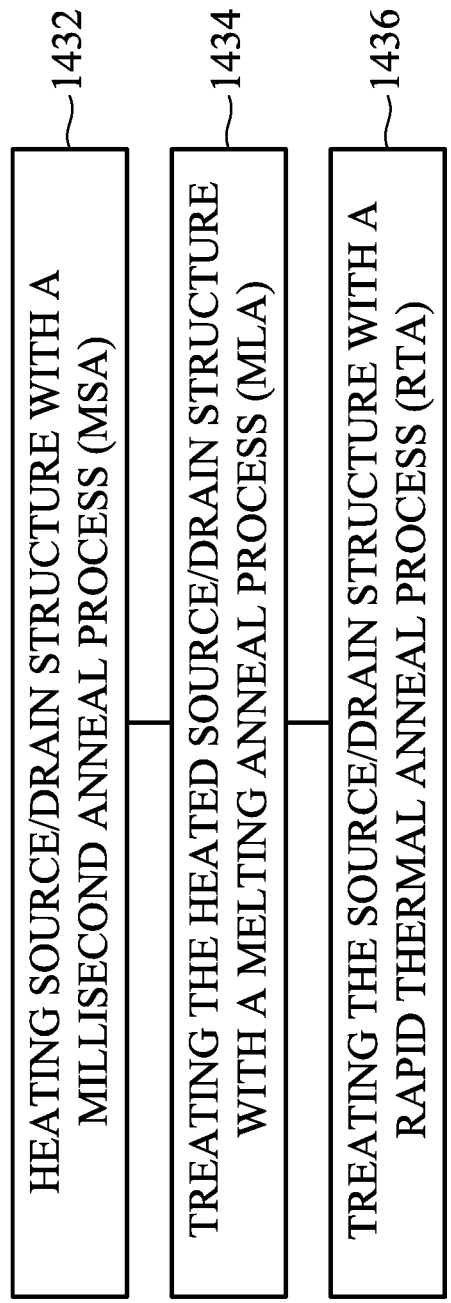

In some embodiments, a millisecond annealing (MSA) process may be further performed for reduced side effects from the annealing processes. The MSA process may utilize a laser anneal or flash anneal process to achieve the annealing times in the range of milliseconds. The MSA process offers lower thermal budget and thus can be used to further control or modify the dopant profiles, thereby enhancing the dopant activation. The MSA may be added in any order to the annealing processes discussed above. In an embodiment shown in FIG. 14B, the MSA process 1408 is performed after the MLA process 1406 (e.g., MLA-MSA). In an embodiment shown in FIG. 14C, the MLA process 1412 is performed after the MSA process 1410 (e.g., MSA-MLA). In another embodiment shown in FIG. 14D, the MSA process 1418 is performed after the RTA process 1414 and the MLA process 1416 (e.g., RTA-MLA-MSA). In yet another embodiment shown in FIG. 14E, the MSA process 1424 is performed after the MLA process 1420 and the RTA process 1422 (e.g., MLA-RTA-MSA). If desired, the MSA process 1426 may be performed prior to the RTA process 1428 and MLA process 1430 (e.g., MSA-RTA-MLA as shown in FIG. 14F). Alternatively, the MSA process 1432 may be performed prior to the MLA process 1434 and RTA process 1436 (e.g., MSA-MLA-RTA as shown in FIG. 14G). An example chamber for performing the MSA process is Astra DSA® chamber available from Applied Materials, Inc. of Santa Clara, California. It is contemplated that a flash lamp annealing process or any advanced process using suitable optical radiation for performing an anneal for a very short amount of time, e.g., on a nanosecond or millisecond time scale, may also be used.

Similar to MLA process, the MSA process may be performed by scanning a laser beam or flashing the whole wafer from an energy source across the exposed surface of the epitaxial source/drain structures 292. In some embodiments, the laser beam may be applied to entire semiconductor substrate 270 or portions of the semiconductor substrate 270. In any case, the laser beam may be delivered to the target area while the semiconductor substrate 270 is translated, or scanned, relative to the energy (or vice versa) delivered to the target area. Likewise, the energy source may be any type of laser such as gas laser, excimer laser, solid-state laser, fiber laser, semiconductor laser, etc. The laser beam or flash lamp may have a wavelength in a range from about 200 nm to about 20 micrometers, such as from about 300 nm to about 1200 nm, for example about 400 nm to about 1000 nm. The annealing temperature may be in a range between about 500° C. to about 1200° C., for example about 800° C. to about 1000° C. The dwell time of the MSA may be in a range from about 0.01 milliseconds to about 10 milliseconds, such as about 0.1 milliseconds to about 5 millisecond, for example 0.2 milliseconds to 2 milliseconds.

After the MLA process (and RTA and/or MSA processes in some cases), silicide layers are formed on the epitaxial source/drain structures 292. Silicide layers are formed to further reduce the contact resistance for the device. In some embodiments, the silicide layers may be formed by forming a metal (such as titanium or tantalum) on at least the exposed surfaces of the epitaxial source/drain structures 292, and annealing to react the metal with the material of the epitaxial source/drain structures 292 to form silicide layers.

Figure 8:
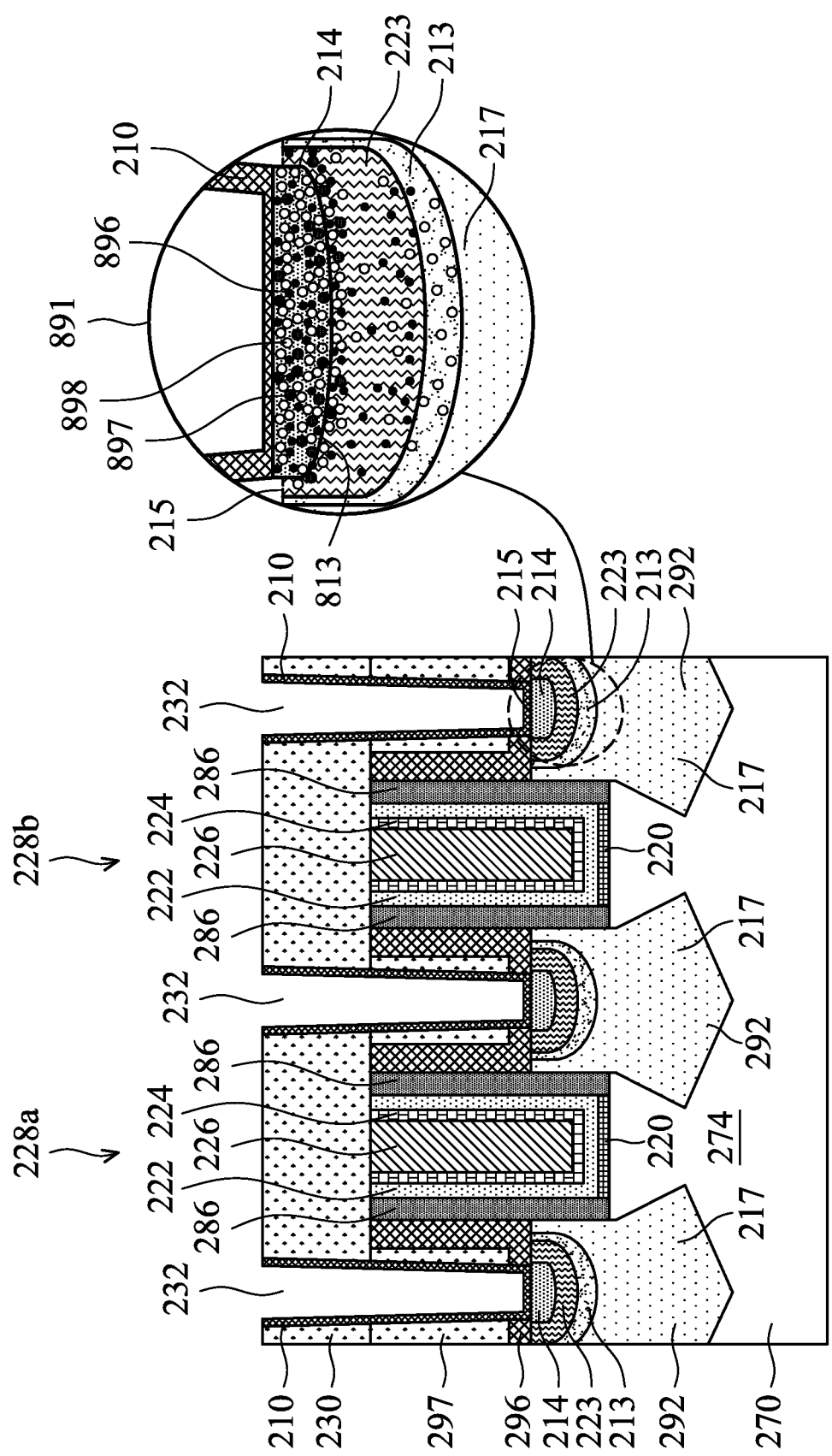

In an embodiment, a conformal metal layer 210 is formed on the surfaces of the exposed epitaxial source/drain structures 292, the first ILD 297, and the CESL 296, as shown in FIG. 8. The metal layer 210 may be a single layer or a multi-layer stack. In cases where a single layer is adapted for the metal layer 210, the metal layer 210 may be or include titanium, tantalum, or the like. In cases where a multi-layer stack (e.g., a bi-layer) is adapted for the metal layer 210, a first layer may be or include titanium, tantalum, or the like, and a second layer may be or include titanium nitride, titanium oxide, tantalum nitride, tantalum oxide, or the like. The first layer may be formed on the second layer, or vice versa. The metal layer 210 may be deposited by atomic layer deposition (ALD), physical vapor deposition (PVD), CVD, or any suitable deposition technique. In some cases where a bi-layer is used, the first layer may be formed by PVD and the second layer may be formed by ALD. In some embodiments, the metal layer 210 is a Ti layer. In another embodiment, the metal layer 210 is a layer stack having a TiN layer formed on a Ti layer.

After the metal deposition, an annealing process is performed to react an upper portion of the epitaxial source/drain structures 292 with the metal layer 210, thereby forming silicide layers 214, as shown in FIG. 8. The substrate 270 is heated to cause the silicide reaction to occur wherever the metal layer 210 is in contact with the epitaxial source/drain structures 292. The silicide reaction may occur at an interface between the epitaxial source/drain structures 292 and the metal layer 210, and a region around and/or beyond the interface between the epitaxial source/drain structures 292 and the metal layer 210. The annealing process may cause the implanted dopants and the germanium atoms to re-distribute throughout the silicide layer 214. In some cases where a layer stack (e.g., Ti/TiN) is used for the metal layer 210, the bottom layer (e.g., Ti) may react with the epitaxial source/drain structure 292 and convert fully into a portion of the silicide layer 214. The portion of the silicide layer 214 may overlap the crystalline regions 223. Inset 891 in FIG. 8 is an enlarged partial view showing an example of the silicide layer 214 formed at the interface between the epitaxial source/drain structures 292 and the metal layer 210. In an example where the metal layer 210 is Ti/TiN layer stack, the silicide layer 214 may be Ti silicide (TiSiGe). As can be seen, the silicide layers 214 may contain and/or be surrounded by first species 896 (e.g., Ga), second species 898 (e.g., B), and germanium atoms 897 that were previously brought up and piled up at the region proximate the top surface of the epitaxial source/drain structures 292.

In some embodiments, the first species 896, the second species 898, and the germanium atoms 897 may have greatest concentration in the silicide regions 892. In some embodiments, the first species 896, the second species 898, and the germanium atoms 897 may also randomly distribute along an interface 813 between the silicide layer 214 and the crystalline region 223. In some examples, the concentrations of the first and second species 896, 898 and the germanium atoms 897 may gradually decrease along the thickness of the epitaxial source/drain structures 292, with the peak concentration being at and/or near the top surface 215 of the epitaxial source/drain structures 292, and lower concentrations (e.g., at least an order of magnitude lower than the peak concentration) being deeper into the epitaxial source/drain structures 292. In further examples, the second species (e.g., B) may have a retrograde profile following the surface pile up, at a distance (measuring from the top surface) greater than the peak concentration. The retrograde profile increases from the lower concentration to a sub-peak concentration along the thickness of the epitaxial source/drain structures 292. The surface pile up and retrograde profiles will be discussed in more detail below with respect to FIGS. 11 and 12. Upon completion of the silicidation process, the silicide layer 214 and/or the interface between the epitaxial source/drain structures 292 and the metal layer 210 can have a greatest concentration of the germanium and greatest concentrations of the implanted dopants (e.g., Ga and B species), which in turn can improve the device performance affected by a short channel effect (SCE) and a drain-induced barrier lowering (DIBL) effect.

The anneal process used during the silicide formation can be, for example, a rapid thermal anneal (RTA) performed at a temperature in a range from about 400° C. to about 650° C., such as about 500° C., for a duration in a range from about 5 seconds to about 60 seconds. The silicide layer 214 may have a thickness in a range from 2 nm to about 20 nm, for example. In some examples, the un-reacted metal layer 210 can be removed by a selective etch process that attacks non-reacted metal layer 210 but does not attack the silicide layer 214. The selective etch process may be any suitable wet etch or a dry etch process. In some examples, the un-reacted metal layer 210 can be used to form an adhesion layer and/or barrier layer.

Figure 9:
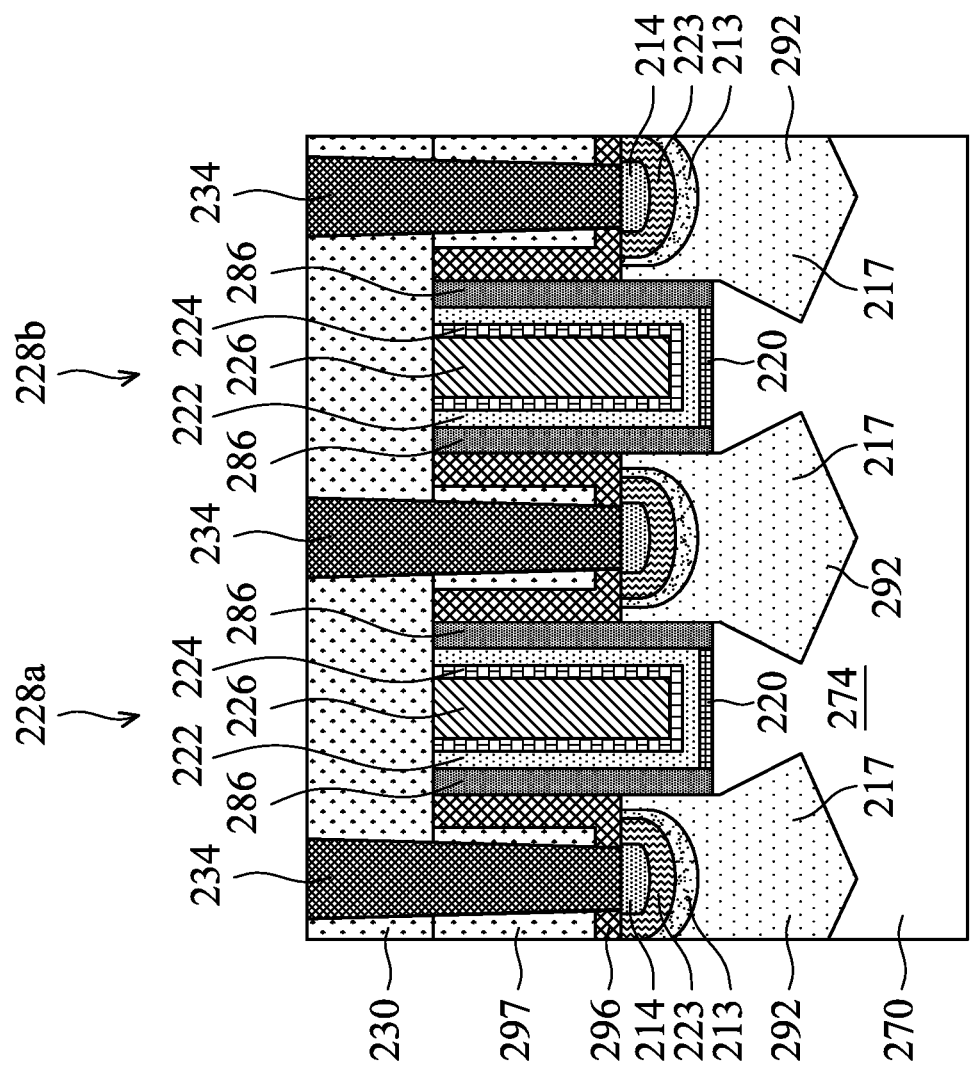

FIG. 9 illustrates the formation of conductive features 234 in the source/drain contact openings 232 to the epitaxial source/drain structures 292. Each conductive feature 234 may include a conformal adhesion layer formed in the exposed surfaces of the source/drain contact openings 232, a barrier layer on the adhesion layer, and conductive material on the barrier layer, for example. The adhesion layer may be or include titanium, tantalum, the like, or a combination thereof, and may be deposited by ALD, CVD, or another deposition technique. The barrier layer may be or include titanium nitride, titanium oxide, tantalum nitride, tantalum oxide, the like, or a combination thereof, and may be deposited by ALD, CVD, or another deposition technique. The conductive material can be deposited on the barrier layer and fill the source/drain contact openings. The conductive material may be or include tungsten, cobalt, copper, ruthenium, aluminum, gold, silver, alloys thereof, the like, or a combination thereof, and may be deposited by CVD, ALD, PVD, or another deposition technique. After the conductive material is deposited, excess conductive material, barrier layer, and adhesion layer may be removed by using a planarization process, such as a CMP, for example. Hence, top surfaces of the conductive features and the second ILD 230 may be coplanar. The conductive features 234 may be referred to as contacts, plugs, etc.

Figure 10:
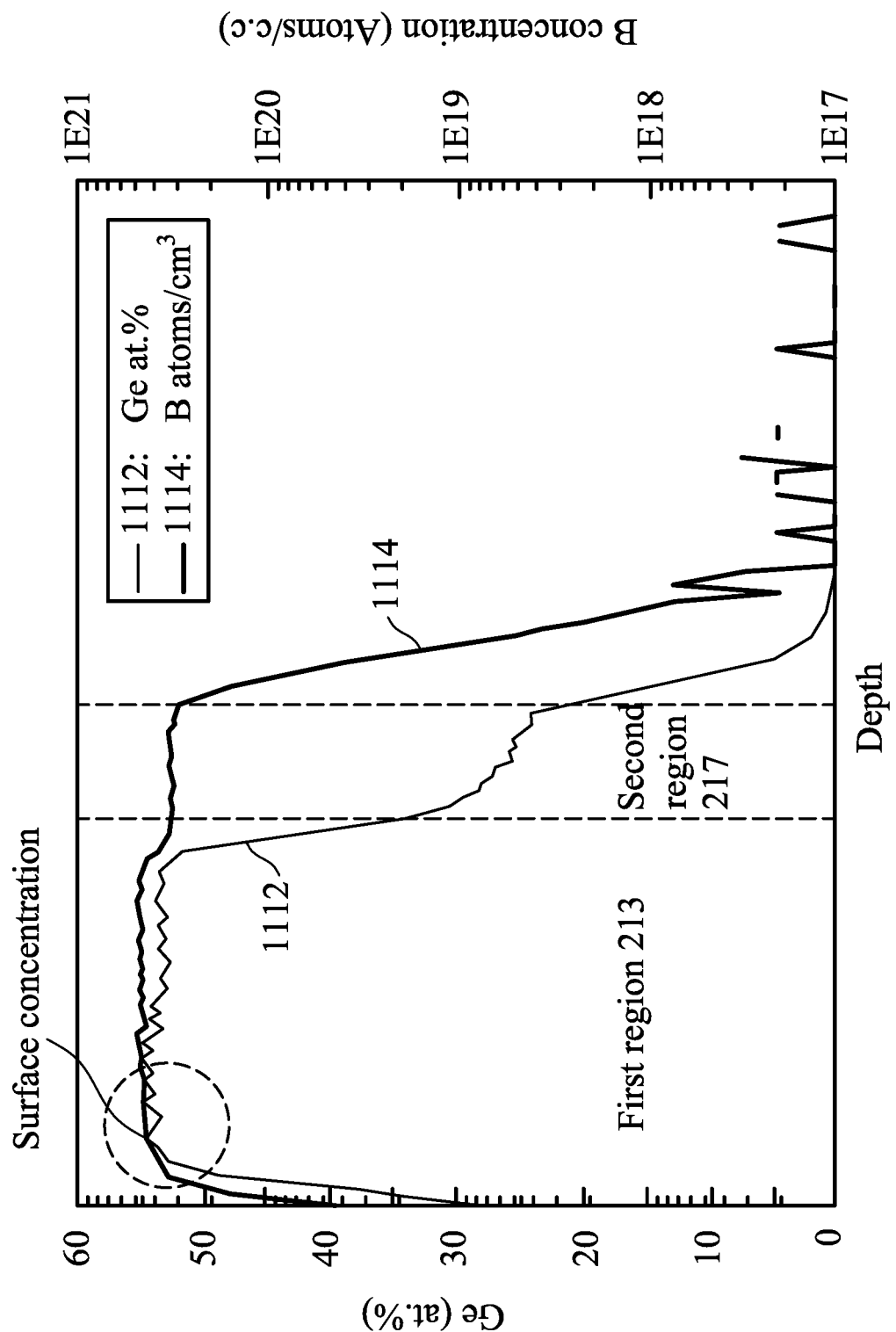
FIG. 10 is a graph illustrating various dopant profiles of the epitaxial source/drain structure of FIG. 9 in accordance with some embodiments.

FIG. 10 is a graph illustrating boron (B) and germanium (Ge) profiles of the epitaxial source/drain structure 292 (without a PAI process, dopant implantation, and any other thermal processes) of FIG. 9 in accordance with some embodiments. The graph illustrates (1) concentration of Ge in atomic percentage (at. %) and (2) dopant concentration of B in atoms per cubic centimeter, as a function of position in the epitaxial source/drain structure 292. The graph shown in FIG. 10 was experimentally obtained without the PAI process, dopant implantation, and any other thermal processes. For purposes of illustration, the dopant and the intrinsic material of the epitaxial source/drain structure 292 are boron and SiGe, respectively. Other materials and dopants, such as the second species discussed above, may be used and have corresponding features.

A first profile 1112 represents a concentration of germanium in the epitaxial source/drain structure 292. A second profile 1114 represents a concentration of boron in the epitaxial source/drain structure 292. The first profile 1112 illustrates the germanium has a near-surface peak concentration of about 53 at. % in the first region 213, which concentration thereafter remains substantially constant in the first region 213 of the epitaxial source/drain structure 292. The first profile 1112 has a decreasing concentration at a first rate at an interface between the first region 213 and the second region 217 to about 30 at. %, and the first profile 1112 thereafter has a decreasing concentration at a second rate less than the first rate through the remaining depth of the second region 217 to about 24 at. %.

Similarly, the second profile 1114 illustrates the boron dopants have a surface concentration of about $4.7\times10^{20}$ cm$^{-3}$ at the top surface 215 of the epitaxial source/drain structure 292, which concentration thereafter remains substantially constant in the first region 213. The second profile 1114 has a decreasing concentration at an interface between the first region 213 and the second region 217 to about $3.3\times10^{20}$ cm$^{-3}$, and that concentration remains substantially constant in the second region 217.

Figure 11:
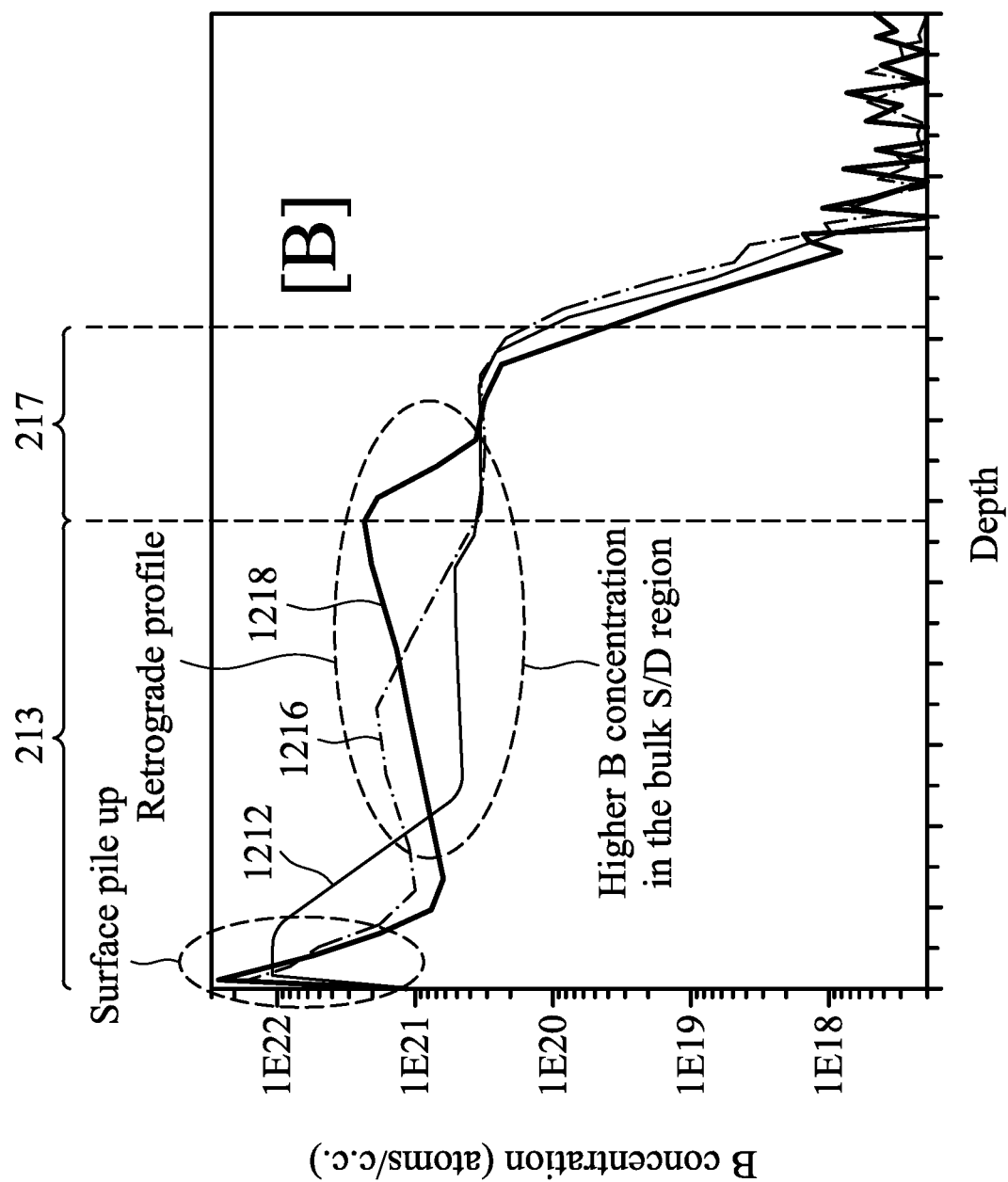
FIGS. 11 and 12 are graphs illustrating various dopant profiles in an epitaxial source/drain structure in accordance with some embodiments.
Figure 12:
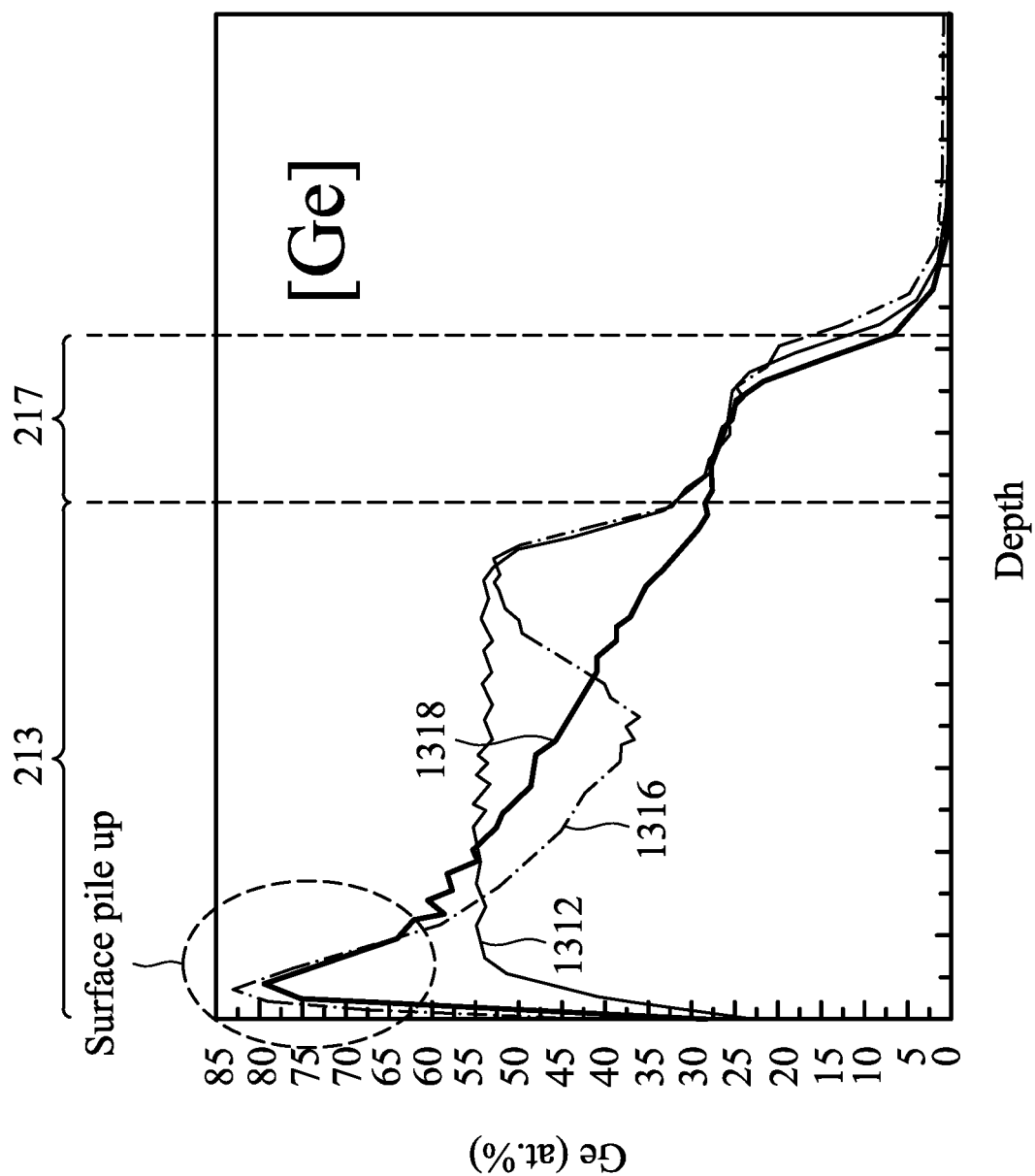

FIGS. 11 and 12 are experimentally obtained by performing the PAI process, dopant implantation, and the MLA process as described above. The graphs illustrate various dopant profiles in an epitaxial source/drain structure, such as the epitaxial source/drain structure 292 of FIG. 9, in accordance with some embodiments. The graph in FIG. 11 illustrates concentrations of boron in atoms per cubic centimeter as a function of depth (e.g., vertical depth) from, for example, the top surface 215 of the epitaxial source/drain structure 292 into the epitaxial source/drain structure 292. For purposes of illustration, the dopant and the intrinsic material of the epitaxial source/drain structure 292 are boron and SiGe, respectively, in these examples. Other materials and dopants, such as the second species discussed above, may be used and have corresponding features.

The first profile 1212 illustrates a boron concentration profile obtained after the PAI process, dopant implantation process and the MSA processes. The first profile 1212 has a peak surface pile up concentration of about $1.1\times10^{22}$ cm$^{-3}$ at the top surface 215 of the epitaxial source/drain structure 292, then has a decreasing concentration with increasing depth to about $4.7\times10^{20}$ cm$^{-3}$ in the first region 213, and that concentration remains substantially constant in the remainder of the first region 213. The first profile 1212 has substantially the same dopant profile as the profile 1114 in the second region 217. The first profile 1212 shows the surface dopant concentration would be higher compared to the profile 1114 if the PAI and dopant implantation processes were performed.

The second profile 1216 illustrates a boron concentration profile obtained after the PAI process, the dopant implantation process, and the MLA process using a laser beam with an energy density of about 1.584 J/cm$^2$. The second profile 1216 has a peak surface pile up concentration of about $2.62\times10^{22}$ cm$^{-3}$ at the top surface 215 of the epitaxial source/drain structure 292. The second profile 1216 then has a decreasing concentration with increasing depth from the near-surface peak concentration to about $1\times10^{21}$ cm$^{-3}$, and then has an increasing concentration to a sub-peak concentration of about $1.8\times10^{21}$ cm$^{-3}$ in the first region 213. The second profile 1216 then has a decreasing concentration from the sub-peak concentration to about $4.5\times10^{20}$ cm$^{-3}$ at/near an interface between the first region 213 and the second region 217. The second profile 1216 then has a decreasing concentration in the second region 217 to about $3.3\times10^{20}$ cm$^{-3}$, and that concentration remains substantially constant throughout the remaining depth of the second region 217. The second profile 1216 shows that both a high surface concentration (surface pile up) profile proximate the top surface 215 and a retrograde profile following the surface pile up of the epitaxial source/drain structure 292 can be obtained at the same time if the MLA process is performed.

The third profile 1218 illustrates a boron concentration profile obtained after the PAI process, the dopant implantation process, and the MLA process using a laser beam with an energy density of about 1.716 J/cm$^2$. Similar to the second profile 1216, the third profile 1218 has a peak surface concentration (surface pile up) of about $2.63\times10^{22}$ cm$^{-3}$ at the top surface 215 of the epitaxial source/drain structure 292. The third profile 1218 then has a decreasing concentration with increasing depth from the near-surface peak concentration to about $6.4\times10^{20}$ cm$^{-3}$, and then has an increasing concentration to a sub-peak concentration of about $2.1\times10^{21}$ cm$^{-3}$ at/near an interface between the first region 213 and the second region 217. The third profile 1218 then has a decreasing concentration in the second region 217 to about $3.3\times10^{20}$ cm$^{-3}$, and that concentration remains substantially constant in the remaining depth of the second region 217. The third profile 1218 shows that both a high surface concentration (surface pile up) profile proximate the top surface 215 and a retrograde profile following the surface pile up of the epitaxial source/drain structure 292 can be obtained at the same time if the MLA process is performed.

The graph in FIG. 12 illustrates concentrations of germanium in atomic percentage (at. %) as a function of depth (e.g., vertical depth) from, for example, the top surface 215 of the epitaxial source/drain structure 292 into the epitaxial source/drain structure 292. The first profile 1312 illustrates a germanium concentration profile obtained after the PAI process, dopant implantation process and the MSA processes. The first profile 1312 has a near-surface peak concentration of 50 at. % to 53 at. % at the top surface 215 of the epitaxial source/drain structure 292, which concentration thereafter remains substantially constant at about 53 at. % in the first region 213. The first profile 1312 has a decreasing concentration at a first rate at an interface between the first region 213 and the second region 217 to about 30 at. %, and the first profile 1312 thereafter has a decreasing concentration at a second rate less than the first rate through the remaining depth of the second region 217 to about 24 at. %. The first profile 1312 shows the Ge profile would keep almost the same as the profile 1112 or only little surface diffusion happens with the μM, dopant implantation and MSA processes.

The second profile 1316 illustrates a germanium concentration profile obtained after the PAI process, the dopant implantation process, and the MLA process using a laser beam with an energy density of about 1.584 J/cm². The second profile 1316 has a peak surface concentration (pile up) of about 82 at. % at the top surface 215 of the epitaxial source/drain structure 292. The peak concentration of the second profile 1316 is about 1.5 to 1.8 times higher than the surface concentration where no MLA process was performed (e.g., the first profile 1312). The second profile 1316 then has a decreasing concentration with increasing depth from the near-surface peak concentration to about 36 at. %, and then has an increasing concentration back to the original bulk concentration of about 53 at. % at an interface between the first region 213 and the second region 217. The second profile 1316 has a decreasing concentration from the bulk concentration of 53 at. % at a first rate to about 30 at. %, and the second profile 1316 thereafter has a decreasing concentration at a second rate less than the first rate through the remaining depth of the second region 217 to about 24 at. %. The second profile 1316 shows that a high surface concentration (pile up) profile proximate the top surface 215 of the epitaxial source/drain structure 292 can be obtained if the MLA process was performed.

The third profile 1318 illustrates a germanium concentration profile obtained after the PAI process, the dopant implantation process, and the MLA process using a laser beam with an energy density of about 1.716 J/cm². Similar to the second profile 1316, the third profile 1318 has a peak surface concentration (pile up) of about 79 at. % at the top surface 215 of the epitaxial source/drain structure 292. The near-surface peak concentration is about 1.5 times higher than the surface concentration where no MLA process was performed (e.g., the first profile 1312). The third profile 1318 has a decreasing concentration with increasing depth to about 28 at. % at an interface between the first region 213 and the second region 217. Then the third profile 1318 has a decreasing concentration at a lesser rate in the second region 217 to about 24 at. %. Likewise, the third profile 1318 shows a high surface concentration proximate the top surface 215 of the epitaxial source/drain structure 292 can be obtained if the MLA process was performed.

The second and third profiles 1216, 1218 shown in FIG. 11 and the second and third profiles 1316, 1318 shown in FIG. 12 illustrate that a high surface concentration (pile up) and a retrograde profile of boron and a high surface concentration (pile up) profile of germanium can be obtained using the MLA process. In addition, with the PAI process and the MLA process, both boron and germanium can be brought upwardly and piled up at the top surface 215 of the epitaxial source/drain structure 292, which can reduce the Schottky barrier height, thereby reducing the contact resistance of the epitaxial source/drain structures, and hence the contact resistance for the contacts. Furthermore, the PAI process and the MLA process can also achieve a higher dopant (e.g., B) concentration in the bulk body of the epitaxial source/drain structure 292 (highlighted in dotted circle) when compared to the first profile 1212, which performs the RTA process without the PAI process and MSA process. Higher boron concentration in the bulk body of the epitaxial source/drain structure can help reduce a contact resistance between the epitaxial source/drain structures and a conductive feature that is subsequently formed.

Figure 13:
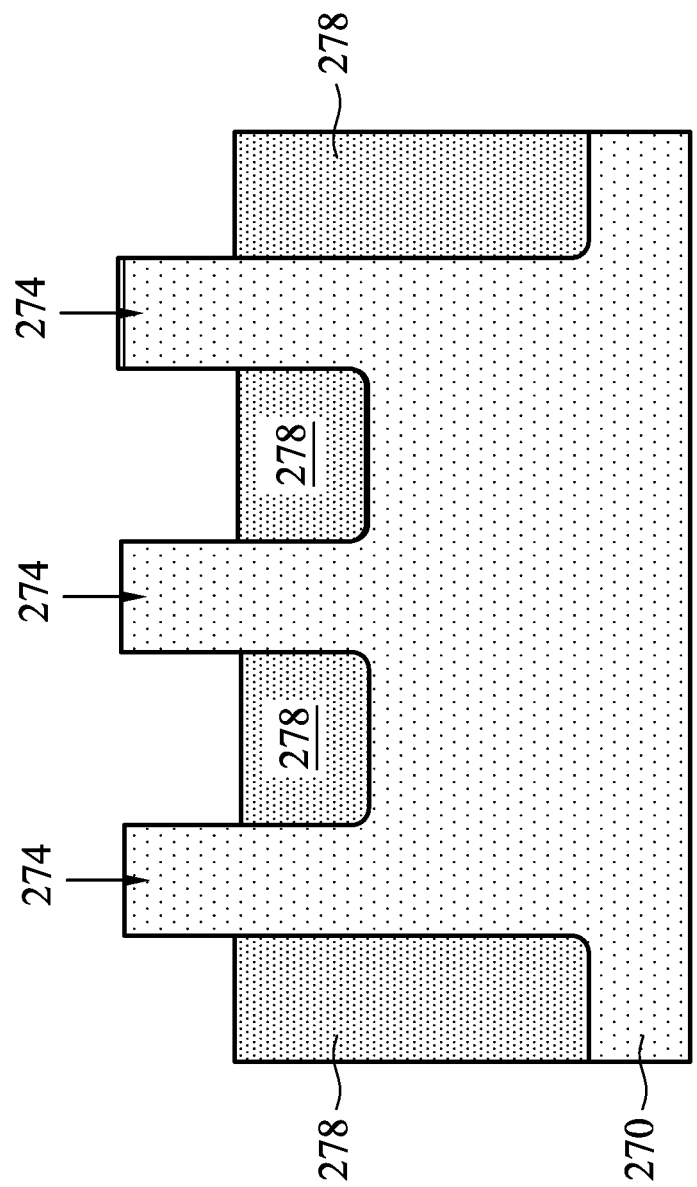
FIG. 13 is a cross-sectional view of a portion of an example structure in accordance with some embodiments.

While the structures may vary in different embodiments, it is contemplated that various embodiments in this disclosure can be applied to FinFETs having fins on a crown structure. FIG. 13 illustrates a cross-sectional view of a portion of a structure in accordance with some embodiments. The structure of FIG. 13 may be referred to as a "crown" structure, whereas the structure of, e.g., FIG. 1 may be referred to as a "non-crown" structure. As depicted in FIG. 13, the lower surfaces of the isolation regions 278 may be at varying levels. This may be obtained during patterning the semiconductor substrate 270 in forming the fins 274, such as by two or more patterning and etching processes.

Various advantages may be present in one or more embodiments. For example, by using an implantation process and a melting anneal (MLA) process performed on a nanosecond scale, a high surface concentration and a retrograde profile of implanted dopants (e.g., B) and high surface concentration of germanium from the intrinsic material of source/drain structures can be obtained at a top surface of the source/drain structure, which can reduce the contact resistance for the silicide contacts for p-type devices. The nanosecond MLA process permits the dopants to be activated with minimal or no diffusion out of the source/drain structures even at high annealing temperature (e.g., 850° C. or above), thereby preventing short channel effect. In addition, the germanium percentage and a degree of amorphousness in source/drain structures can be manipulated to have a lower melting point in the epitaxial source/drain structures, which can enable preferential melting of the source/drain structures when exposed to the nanosecond melting anneal process. This self-selected type annealing allows greater room for high temperature processes to occur in the subsequent processes and hence, lowers the impact on the overall thermal budget for the device fabrication.

In an embodiment, a method for semiconductor processing is provided. The method includes forming a source/drain structure in an active area on a substrate, the source/drain structure including a first region comprising germanium, implanting a first dopant into the first region of the source/drain structure to form an amorphous region in at least the first region of the source/drain structure, implanting a second dopant into the amorphous region containing the first dopant, and heating the source/drain structure to liquidize and convert at least the amorphous region into a crystalline region, the crystalline region containing the first dopant and the second dopant.

In another embodiment, a method for semiconductor processing is provided. The method includes forming a source/drain structure in an active area on a substrate, the source/drain structure including a first region having a first germanium concentration and a second region having a second germanium concentration, the first germanium concentration being greater than the second germanium concentration, forming a dielectric layer over the active area, forming an opening through the dielectric layer to expose at least a portion of an upper surface of the source/drain structure, implanting a first dopant comprising gallium or germanium into the exposed source/drain structure, after implanting the first dopant, implanting at least a second dopant comprising a p-type dopant into the exposed source/drain structure containing the first dopant, subjecting the implanted source/drain structure containing the first dopant and at least the second dopant to a first anneal process, the first anneal process heating the implanted source/drain structure, forming a silicide region at the upper surface of the exposed source/drain structure, and forming a conductive feature in the opening to the upper surface of the source/drain structure.

In yet another embodiment, a structure is provided. The structure includes an active area on a substrate, the active area comprising a source/drain structure, the source/drain structure having a silicide layer disposed thereon, a dielectric layer over the active area, and a conductive feature through the dielectric layer to the silicide layer. The source/drain structure includes a first region proximate a top surface of the source/drain structure and overlapped with at least a portion of the silicide layer, the first region comprising a first concentration profile of a p-type dopant and a second concentration profile of germanium, and a second region disposed between the first region and the substrate, the second region having a third concentration profile of germanium, the third concentration profile decreasing from the second concentration profile at an interface between the first region and the second region in the direction away from the top surface of the source/drain structure. The first concentration profile includes a first surface concentration at the top surface, the first concentration profile increases from the first surface concentration to a first peak concentration, and the first concentration profile decreases from the first peak concentration in a direction away from the top surface of the source/drain structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming an epitaxial structure in an active area on a substrate, the epitaxial structure including a first region comprising germanium;
   implanting a first dopant into the first region of the epitaxial structure to form an amorphous region;
   implanting a second dopant into the amorphous region; and
   recrystallizing the amorphous region into a crystalline region, the crystalline region containing the first dopant and the second dopant.

2. The method of claim 1, wherein the epitaxial structure comprises a second region comprising germanium, wherein the first region has a higher germanium concentration that the second region.

3. The method of claim 2, wherein the second region extends along an entire sidewall of the first region in a cross-sectional view.

4. The method of claim 3, further comprising, prior to implanting the first dopant:
   forming one or more dielectric layers over the epitaxial structure; and
   forming an opening through the one or more dielectric layers, wherein implanting the first dopant is performed through the opening.

5. The method of claim 3, wherein the amorphous region is completely within the first region in the cross-sectional view.

6. The method of claim 1, wherein a molecule of the first dopant is larger than a molecule of a material of the epitaxial structure.

7. The method of claim 6, wherein the first dopant is an electrically inactive species.

8. The method of claim 6, wherein the first dopant is gallium.

9. The method of claim 6, wherein the second dopant is an n-type species or a p-type species.

10. The method of claim 1, wherein the second dopant has a peak concentration in a range from $1\times10^{21}$ cm$^{-3}$ to $2\times10^{22}$ cm$^{-3}$ at a vertical depth in a range from 1 nm to 10 nm.

11. A method of forming a semiconductor device, the method comprising:
   forming a doped active region on a substrate, the doped active region including a first region having a first germanium concentration and a second region having a second germanium concentration, the first germanium concentration being greater than the second germanium concentration, the first region being over the second region;
   forming a dielectric layer over the doped active region;
   forming an opening through the dielectric layer to expose an exposed region of the first region of the doped active region;
   implanting a first dopant into the exposed region, wherein the first dopant has a larger molecule size than a molecule of a material of the doped active region;
   after implanting the first dopant, implanting at least a second dopant comprising a p-type dopant or an n-type dopant into the doped active region containing the first dopant;
   performing a plurality of anneal processes;
   after performing the plurality of anneal processes, forming a silicide region at an upper surface of the exposed region; and
   forming a conductive feature in the opening to the silicide region.

12. The method of claim 11, wherein performing the plurality of anneal processes comprises:
   performing a first anneal to form a recrystallized portion by recrystallizing at least a portion of an amorphous region formed by implanting the first dopant; and
   performing a second anneal to melt at least a portion of the recrystallized portion.

13. The method of claim 11, wherein, after performing the plurality of anneal processes, a first peak concentration of the first dopant is in a range from about 0.5 nm to about 6 nm within a top surface of the doped active region.

14. The method of claim 13, wherein, after performing the plurality of anneal processes, a second peak concentration of the second dopant is in a range from about 0.5 nm to about 6 nm within a top surface of the doped active region.

15. The method of claim 14, wherein, after performing the plurality of anneal processes, the doped active region comprises a doped silicon germanium, where a third peak concentration of germanium is in a range from 0.5 nm to 6 nm within a top surface of the doped active region.

16. A method of forming a semiconductor device, the method comprising:
   epitaxially growing a semiconductor region on a substrate, the semiconductor region comprising silicon germanium with a high Ge concentration region and a low Ge concentration region;
   implanting a first dopant into the semiconductor region to form a first region, the first dopant having a larger molecular size than silicon germanium, the first dopant being an electrically inactive species;
   implanting a second dopant into the first region, the second dopant being an n-type dopant or a p-type dopant; and
   performing a first anneal process to recrystallize the first region to form a recrystallized region;
   performing a second anneal process to liquidize and to move the second dopant towards an upper surface of the semiconductor region; and
   forming a silicide region at the upper surface of the semiconductor region.

17. The method of claim 16, wherein, after the second anneal process, the silicon germanium has a peak germanium concentration near a top surface of the semiconductor region.

18. The method of claim 16, wherein, after performing the second anneal process, the semiconductor region has a germanium concentration profile, the germanium concentration profile having a peak concentration proximate the upper surface of the semiconductor region and decreases from the peak concentration as a depth increases into the semiconductor region.

19. The method of claim 16, wherein the high Ge concentration region has a germanium concentration in a range equal to or greater than about 25 at. %, and wherein the low Ge concentration region has a germanium concentration in a range equal to or less than about 25 at. %.

20. The method of claim 16, wherein a concentration of the first dopant, the second dopant and germanium is greatest in the silicide region.

* * * * *